(12) United States Patent
Ito et al.

(10) Patent No.: US 10,074,519 B2
(45) Date of Patent: Sep. 11, 2018

(54) PLASMA PROCESSING APPARATUS AND FILTER UNIT

(71) Applicant: TOKYO ELECTRON LIMITED, Tokyo (JP)

(72) Inventors: Keiki Ito, Miyagi (JP); Masaki Nishikawa, Miyagi (JP); Naohiko Okunishi, Miyagi (JP); Junichi Shimada, Saitama (JP); Ken Koyanagi, Saitama (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 598 days.

(21) Appl. No.: 14/421,070

(22) PCT Filed: Sep. 9, 2013

(86) PCT No.: PCT/JP2013/005329
§ 371 (c)(1),
(2) Date: Feb. 11, 2015

(87) PCT Pub. No.: WO2014/041792
PCT Pub. Date: Mar. 20, 2014

(65) Prior Publication Data
US 2015/0235809 A1   Aug. 20, 2015

Related U.S. Application Data

(60) Provisional application No. 61/703,817, filed on Sep. 21, 2012.

(30) Foreign Application Priority Data

Sep. 12, 2012 (JP) .................. 2012-200740

(51) Int. Cl.
H01J 37/32 (2006.01)
H03H 1/00 (2006.01)
H01F 17/06 (2006.01)

(52) U.S. Cl.
CPC ...... *H01J 37/32165* (2013.01); *H01F 17/062* (2013.01); *H01J 37/3211* (2013.01);
(Continued)

(58) Field of Classification Search
CPC .. H01F 2017/065; H01F 38/14; H01F 17/062; H01F 17/06; H01L 2924/00;
(Continued)

(56) References Cited

U.S. PATENT DOCUMENTS 8,398,815 B2 * 3/2013 Yamazawa ........ H01J 37/32091
118/723 E
2007/0284344 A1 * 12/2007 Todorov ............ H01J 37/32706
219/121.54
(Continued)

FOREIGN PATENT DOCUMENTS

JP   2-129373 A   5/1990
JP   2006-100465 A   4/2006
(Continued)

OTHER PUBLICATIONS

International Search Report dated Dec. 17, 2013 in PCT/JP2013/005329.

*Primary Examiner* — Aiden Lee
(74) *Attorney, Agent, or Firm* — Rothwell, Figg, Ernst & Manbeck, P.C.

(57) ABSTRACT

Provided is a plasma processing apparatus in which an external circuit is electrically connected, via a line, to a predetermined electric member within a processing container thereof, and noises of first and second high frequency waves are attenuated or blocked by a filter provided on the (Continued)

line when the noises enter the line from the electric member toward the external circuit. The filter includes: an air core coil provided at a first stage when viewed from the electric member side; a toroidal coil connected in series with the air core coil; an electroconductive casing configured to accommodate or enclose the air core coil and the toroidal coil; a first condenser electrically connected between a connection point between the air core coil and the toroidal coil and the casing; and a second condenser connected between a terminal of the toroidal coil at the external circuit side and the casing.

18 Claims, 15 Drawing Sheets

(52) U.S. Cl.
CPC .. *H01J 37/32091* (2013.01); *H01J 37/32174* (2013.01); *H03H 1/0007* (2013.01); *H01J 37/32155* (2013.01); *H01J 2237/334* (2013.01)

(58) Field of Classification Search
CPC ............. H05B 41/295; H05B 41/3925; H01R 13/6658; H01R 24/64; H01R 13/719; H01R 13/6633; H01R 13/7197; H03H 1/0007; H03H 2001/0042; H03H 2001/0085; H03H 7/1766; H03H 7/0115; H03H 2001/005; H03H 7/09; H03H 7/1708; H03H 7/1775; H03H 7/427; H03H 1/00; H03H 7/1758; H03H 2001/0078; H03H 7/0138; H03H 7/175; H03H 7/38; H03H 9/54; H03H 2001/0014; H03H 7/0184; H03H 11/48; H03H 2001/0057; H03H 2001/0092; H03H 2007/013; H03H 5/02; H03H 7/0107; H03H 7/12; H03H 7/1791; H03H 7/40; H03H 7/46; H03H 7/48; H03H 2001/0021; H03H 2001/0035; H03H 2/005; H03H 5/006; H03H 7/0123; H03H 7/0161; H03H 7/0176; H03H 7/1783; H03H 7/18; H03H 7/20; H03H 7/21; H03H 7/32; H03H 7/34; H03H 7/482; H03H 9/132; H03H 9/62; H02M 7/53832; H02M 7/53835; H02M 7/53846; H01J 37/32165; H01J 37/32174; H01J 37/32183
See application file for complete search history.

(56) References Cited

U.S. PATENT DOCUMENTS

| | | | | |
|---|---|---|---|---|
| 2009/0133839 | A1* | 5/2009 | Yamazawa | H01J 37/32091 156/345.37 |
| 2010/0085129 | A1* | 4/2010 | Shuto | H03H 7/38 333/32 |

FOREIGN PATENT DOCUMENTS

| | | |
|---|---|---|
| JP | 2006-238310 A | 9/2006 |
| JP | 2008-34812 A | 2/2008 |
| JP | 2009-123505 A | 6/2009 |
| JP | 2009-164608 A | 7/2009 |
| JP | 2011-135052 A | 7/2011 |
| JP | 2012-89924 A | 5/2012 |

* cited by examiner

PLASMA PROCESSING APPARATUS AND FILTER UNIT

CROSS REFERENCE TO RELATED APPLICATION

This application is a 35 U.S.C. 371 National Phase Entry Application from PCT/JP2013/005329, filed Sep. 9, 2013, which claims priority to and the benefit of U.S. Provisional Application No. 61/703,817, filed Sep. 21, 2012 and Japanese Patent Application No. 2012-200740, filed Sep. 12, 2012, the disclosures of which are incorporated herein in their entirety by reference.

TECHNICAL FIELD

The present invention relates to a plasma processing apparatus that performs a plasma processing on a processing target substrate using high frequency waves. In particular, the present invention relates to a plasma processing apparatus which is provided with a filter configured to cut off high frequency noises entering a line such as, for example, a power feeding line or a signal line from a high frequency electrode or any other electric member in a processing container.

BACKGROUND

In a fine processing using plasma for manufacturing semiconductor devices or flat panel displays (FPDs), the control of a temperature or temperature distribution of a processing target substrate (e.g., a semiconductor wafer or a glass substrate) is very important together with the control of a plasma density distribution on the processing target substrate. Unless the temperature control of the substrate is properly performed, uniformity of a substrate surface reaction or a process characteristic cannot be secured and thus, a manufacturing yield of semiconductor devices or display devices is reduced.

A mounting stage or a susceptor, on which a processing target substrate is mounted within a chamber of a plasma processing apparatus, in particular, a capacitively coupled plasma processing apparatus, generally has a high frequency electrode function for applying high frequency waves to a plasma space, a holder function for holding the substrate using, for example, electrostatic attraction, and a temperature controller function for controlling the substrate to a predetermined temperature with heat transfer. In connection with the temperature control function, it is requested that a distribution of heat input characteristic to a substrate which is caused by non-uniformity of radiant heat from plasma or a chamber wall, or a heat distribution caused by a substrate support structure be properly corrected.

Conventionally, in order to control the temperature of the susceptor and hence the temperature of the substrate, a heater system has been frequently used in which a heating element that generates heat by electrification is embedded in the susceptor and Joule heat generated by the heating element is controlled. However, when the heater system is adopted, the high frequency waves applied to the susceptor from the high frequency power supply are partially apt to enter a hater power feeding line from the heating element as noises. When the high frequency noises get out of the heater power feeding line and reach a heater power supply, the operation or performance of the heater power supply may be disturbed. In addition, when a high frequency current flows through the heater power feeding line, the high frequency power is wastefully consumed. Due to the problems described above, a filter is commonly provided on the heater power feeding line so as to attenuate or block the high frequency noise entering from the heating element embedded in the susceptor. Conventionally, this kind of filter is disposed just below the susceptor and outside the processing container.

In Patent Document 1, the assignee of the present application discloses a filter technique that improves the performance of a filter configured to cut off high frequency waves entering a power feeding line or a signal line from a high frequency electrode or any other electric member within a processing container in a plasma processing apparatus. The filter technique completes a coil contained within the filter using one air core coil by using a regular multiple parallel resonance characteristic.

PRIOR ART DOCUMENT

Patent Document

Patent Document 1: Japanese Patent Laid-Open Publication No. 2011-135052

SUMMARY OF THE INVENTION

Problems to be Solved

A capacitively coupled plasma processing apparatus often applies a plurality of high frequency waves having different frequencies to an electrode within a processing container in order to improve the function and controllability of the high frequency waves in a plasma process. For example, a lower part two-frequency application system applies a first high frequency wave HF having a relatively high basic frequency (typically, 27 MHz or higher) suitable for plasma generation) and a second high frequency wave LF having a relatively low basic frequency (typically, 13 MHz or lower) suitable for ion drawing-in to a susceptor (a lower electrode) on which a processing target substrate is mounted, in a superposed state. In such a case, the noises of the first and second high frequency waves HF, LF simultaneously enter the heater power feeding line through the heating element embedded in the susceptor to control the temperature of the substrate. The filter provided on the heater power feeding line should cut off the high frequency noises of two frequencies at the same time.

In the filter of Patent Document 1 as described above, the inductance required for the air core coil, i.e. the coil size (in particular, the coil length in the axial direction) depends on the basic frequency of the second high frequency wave LF which is the lowest among the frequencies to be cut off Thus, as the basic frequency of the second high frequency wave LF is lowered, the coil length should be increased. For example, when the basic frequency of the second high frequency wave LF is 3.2 MHz, the coil length of 200 mm or more is needed, and when the basic frequency of the second high frequency wave LF is 400 kHz, the coil length of 750 mm or more is needed. However, as the size of the air core coil increases, the resistance of the coil conductor also increases, so that Joule heat generated when a current flows from the heater power supply increases and as a result, power loss within the filter increases. In addition, when the size of the air core coil, i.e. the size of the filter increases, it becomes difficult to design a layout of various necessary power or function supply systems provided below the susceptor or the chamber.

In addition, in the filter of the patent document 1, an enormous number of parallel resonance frequencies appear at approximately constant intervals in a frequency-impedance characteristic of the filter by parallel multiple resonances of distributed constant lines formed by an air core coil and an outer cylindrical conductor that encloses the air core coil. However, most of the parallel resonance frequencies are undesired or unused parallel resonance frequencies. Thus, when a plurality of frequencies are cutting-off targets of the filter, for example, when the basic frequencies of the first and second high frequency waves HF, LF are cutting-off targets as described above, it is very difficult to adjust two frequencies among parallel multiple resonance frequencies to be near to the two basic frequencies simultaneously. In addition, in the parallel multiple resonances, the inclination (change rate) of an impedance characteristic is steep at each parallel resonance point (the impedance characteristic is not a broad characteristic). Thus, even if a deviation between the basic frequency of a cutting-off target and a parallel resonance frequency near to the basic frequency is small, the impedance is considerably reduced compared to a peak value of the parallel resonance points, which may make the filter function ineffective. Thus, it is difficult to design, manufacture and adjust a filter, and a machine difference is also apt to be caused.

The present invention was made in consideration of the above-described problems in the art, and provides a plasma processing apparatus and a filter unit which applies a sufficiently high impedance, in an efficient, stable and reliable manner, to harmful high frequency noises having a plurality of frequencies and entering a line such as, for example, a power feeding line or a signal line from a high frequency electrode or any other electric member within the processing container, thereby improving the reproducibility and reliability of a plasma process.

Means to Solve the Problems

A plasma processing apparatus in a first aspect of the present invention includes an external circuit of a power system or a signal system electrically connected via a line to a predetermined electric member within a processing container where a plasma processing is performed. A noise of a first high frequency wave having a first frequency and a noise of a second high frequency wave having a second high frequency lower than the first frequency are attenuated or blocked by a filter provided on the line when the noises enter the line from the electric member toward the external circuit. The filter includes: an air core coil provided at a first stage when viewed from the electric member side; a toroidal coil connected in series with the air core coil; an electroconductive casing configured to accommodate or enclose the air core coil and the toroidal coil; a first condenser electrically connected between a connection point between the air core coil and the toroidal coil and the casing; and a second condenser connected between a terminal of the toroidal coil at the external circuit side and the casing.

In the plasma processing apparatus of the first aspect, with respect to the noises of the first and second high frequency waves entering the line from the electric member within the processing container toward the external circuit outside the processing container during the plasma processing, the air core coil at the first stage of the filter cuts off the noise of the first high frequency wave having the first frequency, and the toroidal coil at the next stage cuts off the noise of the second high frequency wave having the second frequency and having passed through the air core coil. Here, in the electroconductive casing, the air core coil has a self-resonance frequency near to the first frequency, and the toroidal coil has a self-resonance frequency near to the second frequency. In addition, the first condenser functions to be cable of obtaining a first serial resonance frequency in the middle of the first frequency and the second frequency, and the second condenser functions to be capable of obtaining a second serial resonance frequency in a region lower than the second frequency. As described above, the filter's cutting-off function for the noise of the first high frequency wave having a relatively higher frequency and the filter's cutting-off function for the noise of the second high frequency wave having a relatively lower frequency are allotted to the air core coil and the toroidal coil, respectively.

In a plasma processing apparatus in which a predetermined electric member within a processing container where a plasma processing is performed in a plasma processing apparatus is electrically connected to an external circuit disposed outside the processing container via a line, a filter unit in the first aspect of the present invention is provided in a midway of the line to attenuate or block noises of a plurality of high frequency waves having different frequencies and entering the line from the electric member toward the external circuit. The filter unit includes: an air core coil provided at a first stage when viewed from the electric member side; a toroidal coil connected in series with the air core coil; an electroconductive casing configured to accommodate or enclose the air core coil and the toroidal coil; a first condenser electrically connected between a connection point between the air core coil and the toroidal coil and the casing; and a second condenser connected between a terminal of the toroidal coil at the external circuit side and the casing.

In the filter unit of the first aspect, with respect to the noises of a plurality of high frequency waves entering the line from the electric member within the processing container toward the external circuit outside the processing container during the plasma processing, the air core coil at the first stage of the filter cuts off the noise of a high frequency wave having a relatively higher frequency, and the toroidal coil at the next stage cuts off the noise of a high frequency wave having a relatively lower frequency and having passed through the air core coil. Here, in the electroconductive casing, the air core coil is self-resonant at the higher frequency, and the toroidal coil is self-resonant at the lower frequency. In addition, the first condenser functions to be cable of obtaining a first serial resonance frequency in the middle of the self-resonance frequency of the toroidal coil and the self-resonance frequency of the air core coil, and the second condenser functions to be capable of obtaining a second serial resonance frequency in a region lower than the self-resonance frequency of the toroidal coil. As described above, the filter's cutting-off function for the noise of the high frequency wave having a relatively higher frequency and the filter's cutting-off function for the noise of the high frequency wave having a relatively lower frequency are allotted to the air core coil and the toroidal coil, respectively.

In a plasma processing apparatus in a second aspect of the present invention, a first electrode configured to hold a processing target substrate thereon and a second electrode facing the first electrode are disposed within a processing container where a plasma processing is performed, a first high frequency power supply configured to output a first high frequency wave having a first frequency is electrically connected to the first electrode or the second electrode, a second high frequency power supply configured to output a second high frequency wave having a second frequency lower than the first frequency is electrically configured to the first electrode, and a filter is provided on a power feeding line, which electrically connects a heating element provided in the first electrode and a heater power supply configured to supply power to the heating element with each other, to attenuate or block the noises of the first and second high frequency waves entering the power feeding line through the heating element. The filter unit includes: an air core coil provided at a first stage when viewed from the electric member side; a toroidal coil connected in series with the air core coil; an electroconductive casing configured to accommodate or enclose the air core coil and the toroidal coil; a first condenser electrically connected between a connection point between the air core coil and the toroidal coil, and the casing; and a second condenser connected between a terminal of the toroidal coil at the heater power supply side and the casing.

In the plasma processing apparatus of the second aspect, with respect to the noises of the first and second high frequency waves entering the power feeding line from the heating element embedded in the first electrode within the processing container toward the heater power supply outside the processing container during the plasma processing, the air core coil at the first stage of the filter cuts off the noise of the first high frequency wave having the first frequency, and the toroidal coil at the next stage cuts off the noise of the second high frequency wave having the second frequency and having passed through the air core coil. Here, in the electroconductive casing, the air core coil has a self-resonance frequency near to the first frequency, and the toroidal coil has a self-resonance frequency near to the second frequency. In addition, the first condenser functions to be cable of obtaining a first serial resonance frequency in the middle of the first frequency and the second frequency, and the second condenser functions to be capable of obtaining a second serial resonance frequency in a region lower than the second frequency. As described above, the filter's cutting-off function for the noise of the first high frequency wave having a relatively higher frequency and the filter's cutting-off function for the noise of the second high frequency wave having a relatively lower frequency are allotted to the air core coil and the toroidal coil, respectively.

In addition, in a plasma processing apparatus in which a heating element provided in a first electrode within a processing container where a plasma processing is performed is electrically connected to a heater power supply disposed outside the processing container via a power feeding line, a filter unit in the second aspect of the present invention is provided in a midway of the power feeding line to attenuate or block noises of a plurality of high frequency waves having different frequencies and entering the power feeding line from the heating element toward the external circuit. The filter unit includes: an air core coil provided at a first stage when viewed from the heating element side; a toroidal coil connected in series with the air core coil; an electroconductive casing configured to accommodate or enclose the air core coil and the toroidal coil; a first condenser electrically connected between a connection point between the air core coil and the toroidal coil, and the casing; and a second condenser connected between a terminal of the toroidal coil at the heater power supply side and the casing.

In the filter unit of the second aspect, with respect to the noises of a plurality of high frequency waves entering the power feeding line from the heating element embedded in the first electrode within the processing container toward the power feeding line outside the processing container during the plasma processing, the air core coil at the first stage of the filter cuts off the noise of a high frequency wave having a relatively higher frequency, and the toroidal coil at the next stage cuts off the noise of a high frequency wave having a relatively lower frequency and having passed through the air core coil. Here, in the electroconductive casing, the air core coil is self-resonant at the relatively higher frequency, and the toroidal coil is self-resonant at the relatively lower frequency. In addition, the first condenser functions to be cable of obtaining a first serial resonance frequency in the middle of the self-resonance frequency of the toroidal coil and the self-resonance frequency of the air core coil, and the second condenser functions to be capable of obtaining a second serial resonance frequency in a region lower than the self-resonance frequency of the toroidal coil. As described above, the filter's cutting-off function for the noise of the high frequency wave having a relatively higher frequency and the filter's cutting-off function for the noise of the high frequency wave having a relatively lower frequency are allotted to the air core coil and the toroidal coil, respectively.

Effect of the Invention

According to the plasma processing apparatus and the filter unit of the present invention, with the configurations and actions described above, a sufficiently high impedance is applied, in an efficient, stable and reliable manner, to harmful high frequency noises having a plurality of frequencies and entering a line such as, for example, a power feeding line or a signal line from a high frequency electrode or any other electric member within the processing container, so that the reproducibility and reliability of a plasma process can be improved.

DETAILED DESCRIPTION TO EXECUTE THE INVENTION

Hereinafter, exemplary embodiments of the present invention will be described in detail with reference to the accompanying drawings.

[Entire Configuration of Plasma Processing Apparatus]

Figure 1:
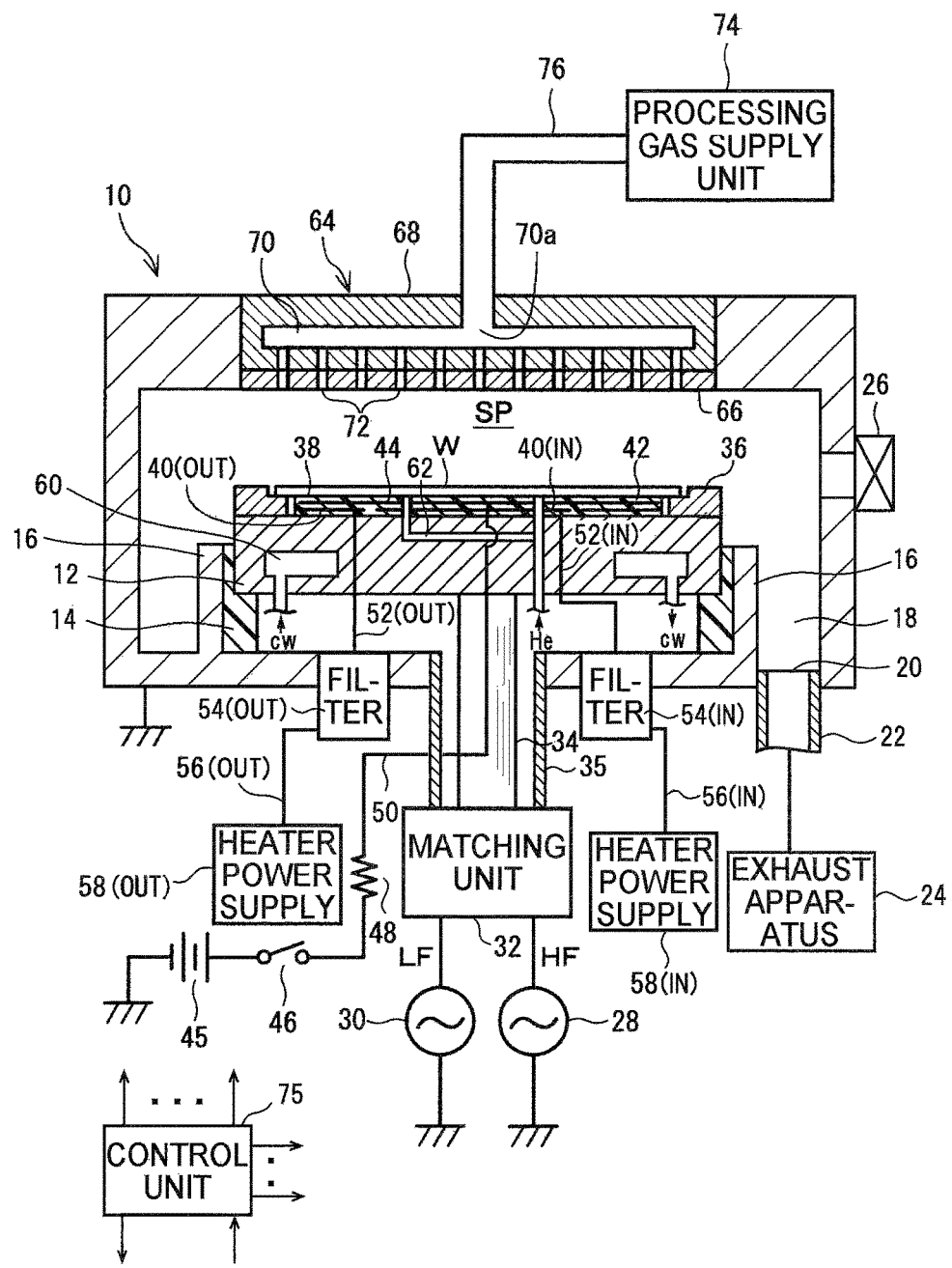
FIG. 1 is a cross-sectional view illustrating an entire configuration of a plasma processing apparatus according to a first exemplary embodiment of the present invention.

FIG. 1 illustrates a configuration of a plasma processing apparatus according to a first exemplary embodiment of the present invention. The plasma processing apparatus is configured as a capacitively coupled plasma etching device of a lower part two-frequency application type, and includes, for example, a cylindrical chamber (processing container) 10 made of a metallic material such as, for example, aluminum or stainless steel. The chamber 10 is grounded.

Within the chamber 10, a disc-shaped susceptor 12, on which a processing target substrate such as, for example, a semiconductor wafer W, is disposed, is horizontally disposed as a lower electrode. The susceptor 12 is made of, for example, aluminum, and supported by an insulative cylindrical support unit 14 in a non-ground manner. The insulative cylindrical support unit 14 extends vertically upwardly from the bottom of the chamber 10 and is made of, for example, ceramic. An annular exhaust path 18 is formed between a cylindrical electroconductive support unit 16 extending vertically upward from the bottom of the chamber 10 along the outer periphery of the insulative cylindrical support unit 14 and the inner wall of the chamber 10, and an exhaust port 20 is formed in the bottom of the exhaust path 18. An exhaust apparatus 24 is connected to the exhaust port 20 via an exhaust pipe 22. Since the exhaust apparatus 24 includes a vacuum pump such as, for example, a turbo molecular pump, so that the processing space within the chamber 10 may be decompressed to a desired vacuum degree by the exhaust apparatus 24. A gate valve 26 configured to open/close a carry-in/out port of a semiconductor wafer W is attached to the side wall of the chamber 10.

The susceptor 12 is electrically connected with first and second high frequency power supplies 28, 30 via a matching unit and a power feeding rod 34. Here, the first high frequency power supply 28 outputs a first high frequency wave HF having a predetermined frequency (typically, 27 MHz or more) which mainly contributes to plasma generation. Meanwhile, the second high frequency power supply 30 outputs a second high frequency wave LF (typically, 13 MHz or less) which mainly contributes to ion drawing-in to the semiconductor wafer W on the susceptor 12. First and second matchers (not illustrated) are accommodated in the matching unit 32 to match impedances between the first and second high frequency power supplies 28, 30 and plasma load.

The power feeding rod 34 includes a cylindrical or columnar conductor having a predetermined outer diameter. The top end of the power feeding rod 34 is connected to the center of the bottom of the susceptor 12, and the bottom end of the power feeding rod 34 is connected to high frequency output terminals of the first and second matchers within the matching unit 32. In addition, a cylindrical conductor cover 35 is provided between the bottom of the chamber 10 and the matching unit 32 to enclose the periphery of the power feeding rod 34. More specifically, a circular opening having a predetermined diameter larger than the outer diameter of the power feeding rod 34 is formed in the bottom (lower surface) of the chamber 10, the top end of the conductor cover 35 is connected to the opening of the chamber, and the bottom end of the conductor cover 35 is connected to the grounds (return lines) of the matchers.

The susceptor 12 has a diameter or aperture larger than the semiconductor wafer W. The top surface of the susceptor 12 is divided into a central region, i.e. a wafer mounting part, having a shape and size which are substantially the same as the shape (circular shape) and size of the semiconductor wafer W, and an annular peripheral part extending outside the wafer mounting part. The wafer W is mounted on the wafer mounting part as a processing target. A ring-shaped sheet material so-called a focus ring 36 is attached above the annular peripheral part. The focus ring 36 has an inner diameter which is larger than the diameter of the semiconductor wafer W. The focus ring 36 is made of any one of Si, SiC, C, and $SiO_2$, for example, depending on an etching target material of the semiconductor wafer W.

An electrostatic chuck 38 for wafer attraction and a heating element 40 are provided in the wafer mounting part of the top surface of the susceptor 12. The electrostatic chuck 38 includes a DC electrode 44 enclosed in a film or plate-shaped dielectric material 42 which is integrally formed on or integrally fixed to the top surface of the susceptor 12, and the DC electrode 44 is electrically connected with an external DC power feeding line 45 disposed outside the chamber 10 via a switch 46, a resistor 48 with a high resistance value, and a high DC voltage line 50. When a high DC current is applied to the DC electrode 44 from the DC power supply 45, the semiconductor wafer W may be attracted to and held on the electrostatic chuck 38 by a Coulomb force. Meanwhile, the high DC power feeding line 50 is a coated wire which passes through the inside of the cylindrical lower power feeding rod 34 and penetrates the susceptor 12 from the bottom side to be connected with the DC electrode 44 of the electrostatic chuck 38.

Figure 2:
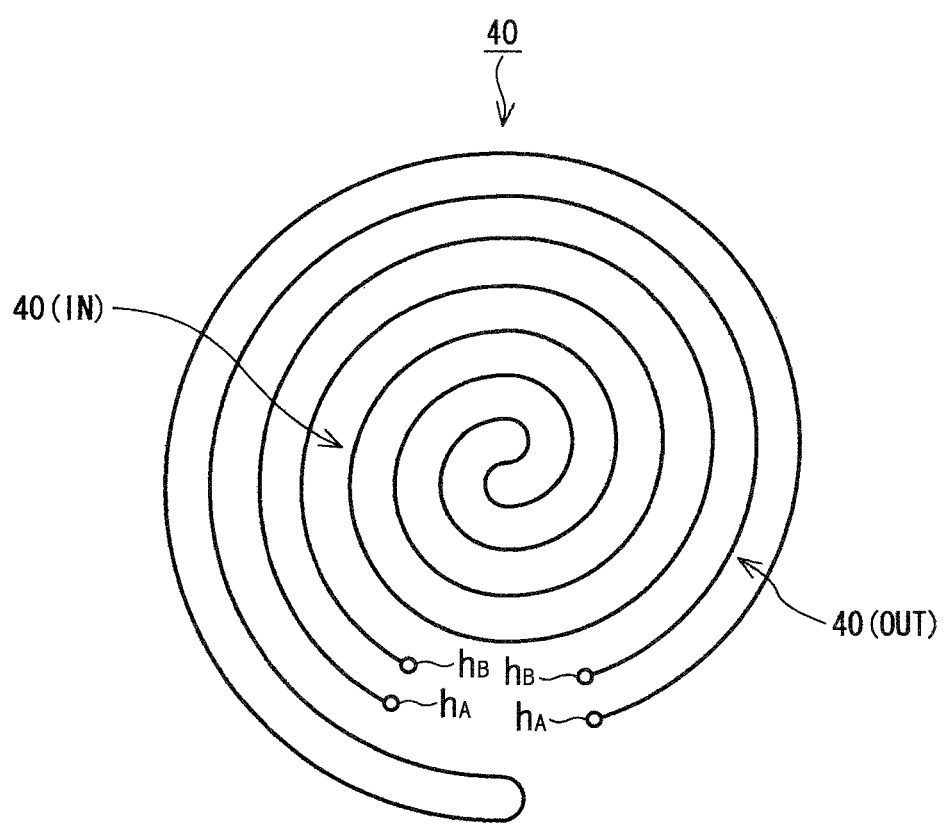
FIG. 2 is a schematic plan view illustrating a configuration of a heating element provided in a susceptor (lower electrode) of the plasma processing apparatus.

The heating element 40 includes, for example, a spiral resistance-heating wire enclosed in the dielectric material 42 together with the DC electrode 44 of the electrostatic chuck 38. In the present embodiment, as illustrated in FIG. 2, the heating element 40 is bisected into an inner heating line 40(IN) and an outer heating line 40(OUT) in the radial direction of the susceptor 12. Among them, the inner heating line 40(IN) is electrically connected to a dedicated heater power supply 58(IN) which is disposed outside the chamber 10, through an insulation-coated power feeding conductor 52(IN), a filter unit 54(IN), and an electric cable 56(IN). The outer heating line 40(OUT) is electrically connected to a dedicated heater power supply 58(OUT), which is also disposed outside the chamber 10, through an insulation-coated power feeding conductor 52(OUT), a filter unit 54(OUT), and an electric cable 56(OUT). Among them, the filter unit 54(IN) and the filter unit 54(OUT) are main features in the present exemplary embodiment, and the internal configurations and actions thereof will be described in detail below.

An annular coolant chamber or a coolant passage 60 is formed inside the susceptor 12 to extend, for example, in the circumferential direction. The coolant chamber 60 is supplied with a coolant having a predetermined temperature such as, for example, cooling water cw, through a coolant supply pipe from a chiller unit (not illustrated). The temperature of the susceptor 12 may be controlled by the temperature of the coolant to be lowered. In addition, in order to thermally couple the semiconductor wafer W to the susceptor 12, a heat transfer gas from a heat transfer gas supply unit (not illustrated), for example, He gas, is adapted to be supplied to a contact interface between the electrostatic chuck 38 and the semiconductor wafer W through a gas supply pipe and a gas passage 62 inside the susceptor 12.

A shower head 64 is provided on the ceiling of the chamber 10 to face the susceptor 12 in parallel in which the shower head 64 also serves as an upper electrode. The shower head 64 includes an electrode plate 66 facing the susceptor 12, and an electrode support 68 removably supporting the electrode plate 66 behind (above) the electrode plate 66. A gas chamber 70 is provided inside the electrode support 68, and a plurality of gas ejection holes 72 are formed in the electrode support 68 and the electrode plate 66 to extend from the gas chamber 70 to the susceptor 12 side. A space SP formed between the electrode plate 66 and the susceptor 12 serves as a plasma generation space or a plasma processing space. A gas inlet port 70a provided in the upper portion of the gas chamber 70 is connected with a gas supply pipe 76 extending from a processing gas supply unit 74. The electrode plate 66 is made of, for example, Si, SiC or C, and the electrode support 68 is made of, for example, an anodized aluminum.

The individual operations of the respective components within the plasma etching apparatus, for example, the exhaust apparatus 24, the high frequency power supplies 28, 30, the switch 46 of the DC power supply 45, the heater power supplies 58(IN), 58(OUT), the chiller unit (not illustrated), the heat transfer gas supply unit (not illustrated), and the processing gas supply unit 74, and the operations (sequence) of the entire plasma etching apparatus are controlled by a control unit 75 including a microcomputer.

Basic operations of a sheet type dry etching in the plasma etching apparatus are performed as follows. First, the gate valve 26 is opened, and a semiconductor wafer W is carried into the chamber 10 as a processing target and mounted on the electrostatic chuck 38. In addition, an etching gas (in general, a mixed gas) is introduced into the chamber 10 at a predetermined flow rate from the processing gas supply unit 74 and the pressure within the chamber is adjusted to a set value by the exhaust apparatus 24. In addition, the first and second high frequency power supplies 28, 30 are turned ON to output a first high frequency wave HF and a second high frequency wave LF with a predetermined power, respectively, and the high frequency waves HF and LF are applied to the susceptor (lower electrode) 12 through the matching unit 32 and the power feeding rod 34. In addition, the heat transfer gas (He gas) is supplied to the contact interface between the electrostatic chuck 38 and the semiconductor wafer W from the heat transfer gas supply unit, and the switch 46 for the electrostatic chuck is turned ON to confine the heat transfer gas in the contact interface by an electrostatic attraction force. Meanwhile, the heater power supplies 58(IN), 58(OUT) are turned ON so as to cause the inner heating line 40(IN) and the outer heating line 40(OUT) to generate Joule heat independently from each other, thereby controlling the temperature or temperature distribution of the top surface of the susceptor 12 to a set value. The etching gas ejected from the shower head 64 is turned into plasma between both electrodes 12, 64 by high frequency discharge, and a processing target film on the surface of the semiconductor wafer W is etched to a desired pattern by radicals or ions generated by the plasma.

The plasma etching apparatus is a cathode-coupled type and applies a first high frequency wave HF having a relatively high basic frequency (27 MHz or more) suitable for plasma generation to the susceptor 12 so as to make the plasma higher in density in a desirable dissociated state so that high density plasma can be formed even under a lower pressure condition. At the same time, a second high frequency wave LF having a relatively low basic frequency (13 MHz or less) suitable for drawing-in of ions is applied to the susceptor 12 so that an anisotropic etching with high selectivity can be performed on the semiconductor wafer W on the susceptor 12.

In addition, in the capacitively coupled plasma etching apparatus, the susceptor 12 is cooled and heated simultaneously by the chiller and the heater, and the heating by the heater is independently controlled at the central portion and the edge portion in the radial direction. Thus, temperature may be rapidly switched, or raised or lowered, and a temperature distribution profile may be optionally or variously controlled.

In addition, in the capacitively coupled plasma etching apparatus, during the plasma etching, some of the first and second high frequency waves HF and LF applied to the susceptor 12 from the high frequency power supplies 28, 30 enter the power feeding conductors 52(IN), 52(OUT) as high frequency noises through the inner heating line 40(IN) and the outer heating line 40(OUT) which are embedded in the susceptor 12. When any of these two-frequency high frequency noises rushes into the heater power supplies 58(IN), 58(OUT), the operations and performances of the heater power supplied 58(IN), 58(OUT) may be impaired.

In connection with this point, as described above, the filter units 54(IN), 54(OUT) are provided on the heater power feeding lines that electrically connect the heater power supplies 58(IN), 58(OUT) and the inner and outer heating lines 40(IN), 40(OUT). As described in detail below, the filter units 54(IN), 54(OUT) exert a filter's cutting-off function with a sufficiently high impedance, in an efficient, stable and reliable manner with low power consumption, on either of the noises of the first and second high frequency waves HF and LF entering the heater power feeding lines from the inner and outer heating lines 40(IN), 40(OUT). Thus, the plasma etching apparatus of the present exemplary embodiment improves a heater type wafer temperature control function, and efficiently prevents or reduces leakage of the powers of the first and second high frequency waves HF and LF to the heater power feeding lines through the heating element 40 inside of the susceptor 12 from the chamber 10, thereby improving the reproducibility and reliability of the plasma process.

[Circuit Configuration within Filter Unit]

Subsequently, descriptions will be made on a circuit configuration within the filter units 54(IN), 54(OUT) which are main features in the plasma etching apparatus.

Figure 3:
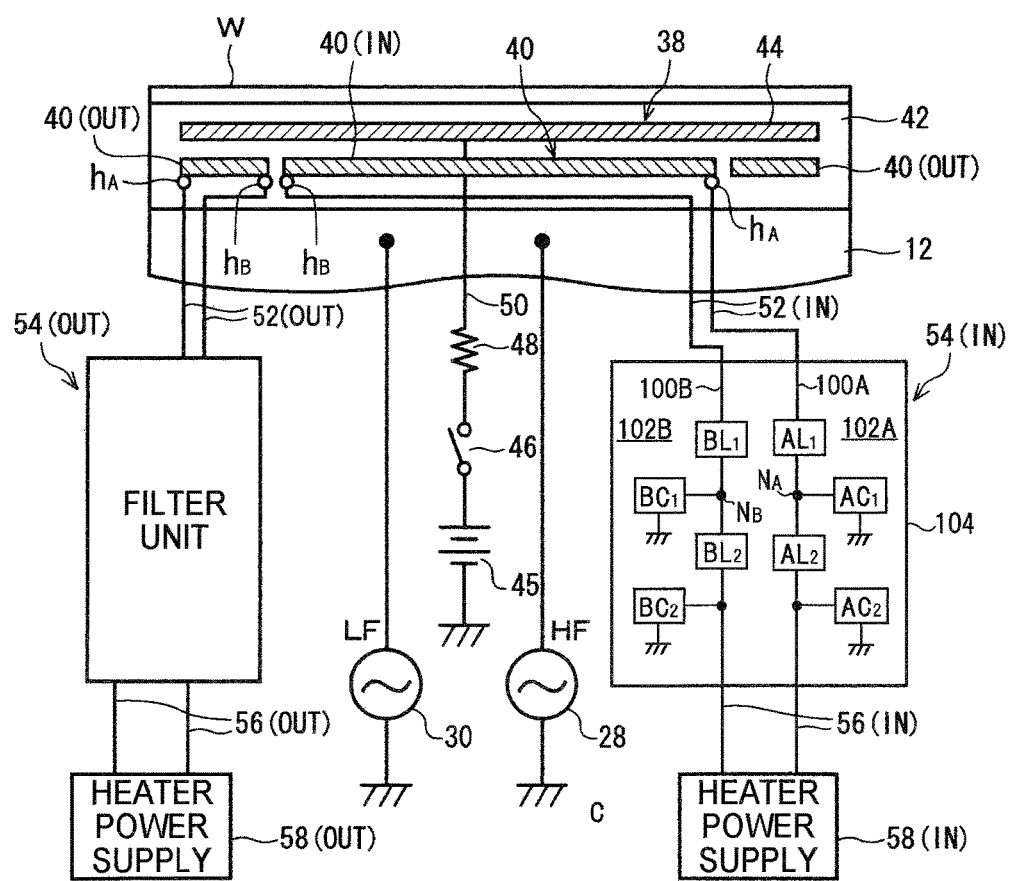
FIG. 3 is a view illustrating a circuit configuration of a heater power feeding unit configured to supply power to the heating element.

FIG. 3 illustrates a circuit configuration of a heater power feeding unit configured to supply power to the heating element 40 to control the temperature of the wafer mounted on the susceptor 12. In the present exemplary embodiment, the inner heating line 40(IN) and the outer heating line 40(OUT) of the heating element 40 are respectively connected with individual heater power feeding units which have substantially the same circuit configuration, so that the calorific amounts or heating temperatures of the inner heating line 40(IN) and the outer heating line 40(OUT) can be independently controlled. In the following description, the configurations and actions of the heater power feeding unit for the inner heating line 40(IN) will be described. The description can also be completely applied to the configurations and actions of the heater power feeding unit for the outer heating line 40(OUT).

The heater power supply 58(IN) is an AC power source that performs a switching (ON/OFF) operation at, for example, a commercial frequency using an SSR, and is connected with the inner heating line 40(IN) by a closed loop circuit. More specifically, among a pair of output terminals of the heater power supply 58(IN), a first output terminal is electrically connected to a first terminal $h_A$ of the inner heating line 40(IN) through a first power feeding line (power supply line) 100A, and a second output terminal is electrically connected to a second terminal $h_B$ of the inner heating line 40(IN) through a second power feeding line (power supply line) 100B.

The filter unit 54(IN) includes first and second filters 102A, 102B accommodated in a grounded electro conductive casing 104 on the first and second power feeding lines 100A, 100B. Each of the first and second filters 102A, 102B includes a plurality of reactance elements [$AL_1$, $AC_1$, $AL_2$, $AC_2$], [$BL_1$, $BC_1$, $BL_2$, $BC_2$]. The circuit configurations of the filters 102A, 102B are substantially the same, and the characteristic values of the reactance elements corresponding to each other between the filters are also substantially the same.

More specifically, in each of the filters 102A, 102B, the coils $AL_1$, $BL_1$ at the first stage and the coils $AL_2$ or $BL_2$ at the next stage are connected in series in this order when viewed from the heating element 40 on the power feeding lines 100A, 100B, first condensers $AC_1$, $BC_1$ are connected between connection points $N_A$, $N_B$ between the coils $AL_1$, $BL_1$ at the first stage and the coils $AL_2$, $BL_2$ at the next stage and the casing 104, and second condensers $AC_2$, $BC_2$ are electrically connected between the heater power supply 58(IN) side terminals of the coils $AL_2$, $BL_2$ at the next state and the casing 104.

In the heater power feeding unit configured as described above, in a positive polarity cycle, the current output from the heater power supply 58(IN) enters the inner heating line 40(IN) from one terminal $h_A$ via the first power feeding line 100A, i.e. the electric cable 56(IN), the coil $AL_2$ at the next stage, the coil $AL_1$ at the first stage, and the power feeding conductor 52(IN), generating Joule heat in each segment of the inner heating line(40)(IN), and after coming out from the other terminal $h_B$, the current returns via the second power feeding line 100B, i.e. the power feeding conductor 52(IN), the coil $BL_1$ at the first stage, the coil $BL_2$ at the next stage, and the electric cable 56(IN). In the negative polarity cycle, the current flows through the same circuit in the direction opposite to the direction described above. Since the current of the AC power is typically 50 Hz to several hundreds of Hz, the voltage drop in each of the coils $AL_1$, $BL_1$, $AL_2$, $BL_2$ is small to be ignorable, and the leakage current passing through each of the condensers $AC_1$, $BC_1$, $AC_2$, $BC_2$ to the earth is small to be ignorable. As described below, in the present exemplary embodiment, each of the coils $AL_1$, $BL_1$ at the first stage includes an air core coil, and each of the coils $AL_2$, $BL_2$ at the next stage includes a toroidal coil.

[Physical Structure in Filter Unit]

Figure 4:
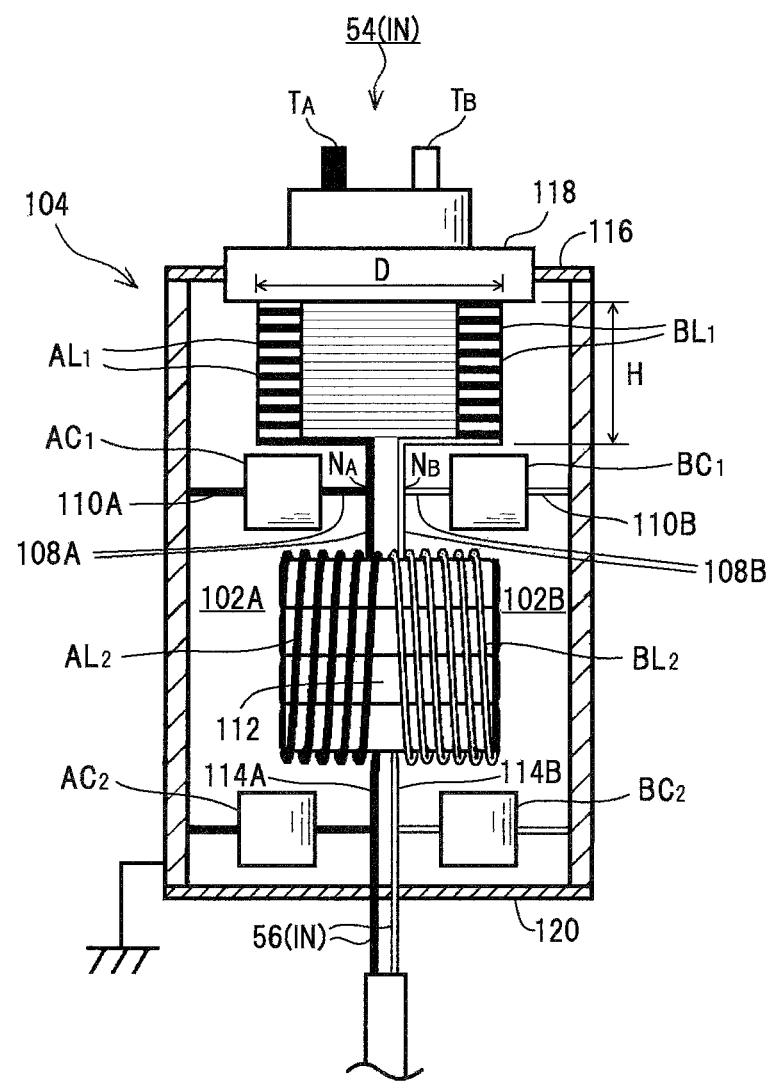
FIG. 4 is a vertical cross-sectional view illustrating a physical structure of the filter unit in the first exemplary embodiment.
Figure 5:
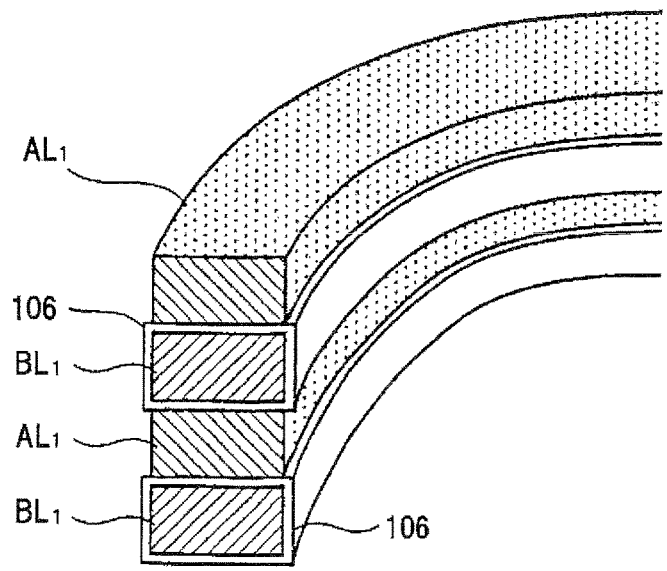
FIG. 5 is a perspective view illustrating a part of a structure of an air core coil provided in the filter unit in an enlarged scale.
Figure 6:
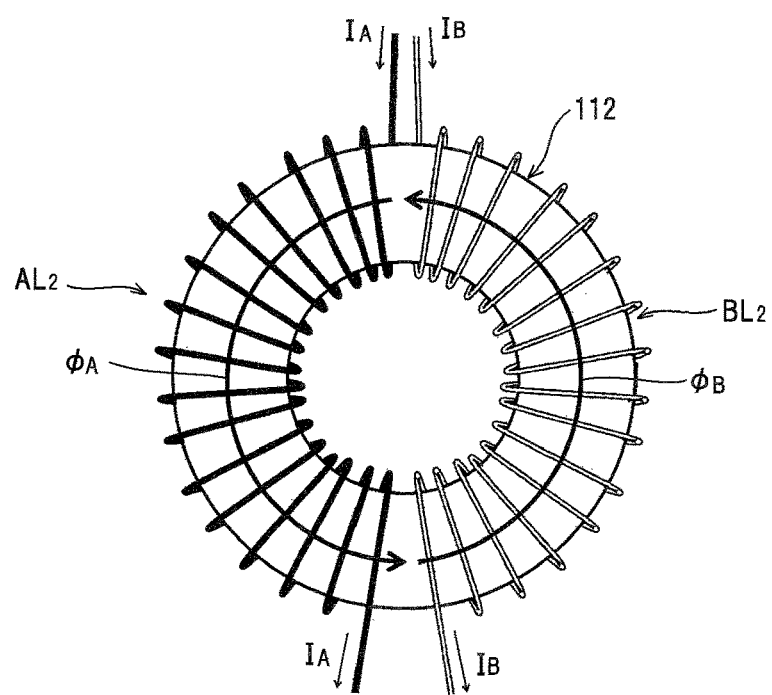
FIG. 6 is a plan view illustrating a structure of a toroidal coil provided in the filter unit.
Figure 7:
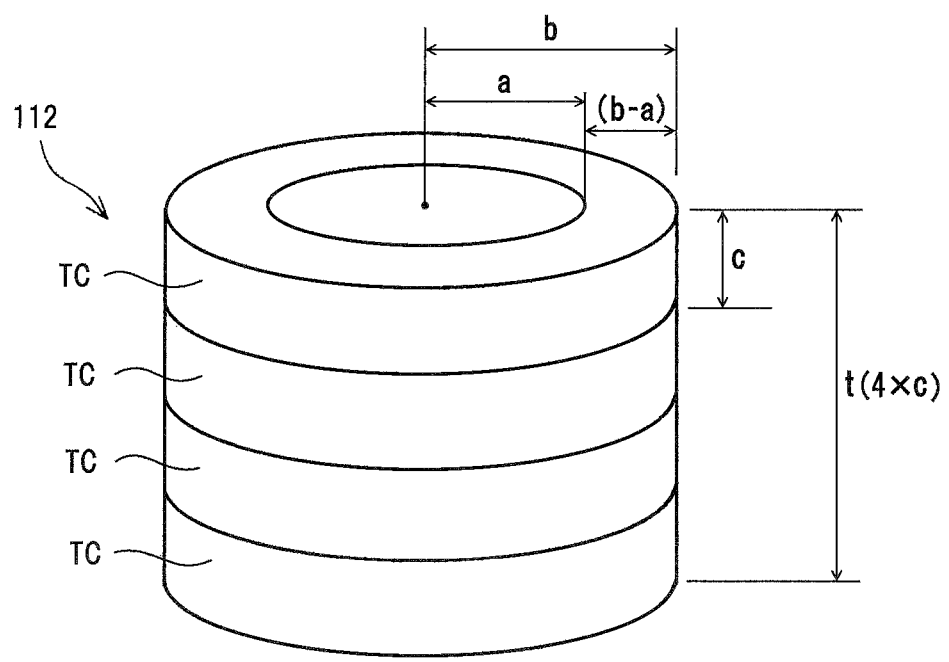
FIG. 7 is a perspective view illustrating an external configuration of a toroidal core in the toroidal coil.

FIG. 4 illustrates a physical structure in the filter unit 54(IN) in the present exemplary embodiment. FIGS. 5 to 7 illustrate main portions in the filter unit 54(IN).

As illustrated in FIG. 4, the filter unit 54(IN) includes air core coils $AL_1$, $BL_1$, first condensers $AC_1$, $BC_1$, toroidal coils $AL_2$, $BL_2$, and second condensers $AC_2$, $BC_2$ which are disposed in a grounded cylindrical electroconductive casing 104 in this order in the downward direction.

As illustrated in FIG. 4, the air core coils $AL_1$, $BL_1$ may be disposed coaxial to the casing 104 and wound spirally at the same winding intervals and coil length H while progressing in parallel to be superposed one on another in the axial direction (vertical direction). As illustrated in FIG. 5, the coil conductors of the coils $AL_1$, $BL_1$ may include thin or square copper wires having the same cross-sectional area, and the coil conductors of one air core coil $BL_1$ is covered by an insulator tube 106.

In the present exemplary embodiment, in order to make the air core coils $AL_1$, $BL_1$ function as concentration constant elements for the first high frequency wave HF and the second high frequency wave LF, the ratio H/D of the coil length H in relation to the coil diameter (outer diameter) D has been set to be considerably smaller than that of a conventional one. H/D may set to be 1 or less. The considerably short length of the air core coils $AL_1$, $BL_1$ (the considerably small number of turns N) as described above not only contributes to reducing the inductances of the air core coils $AL_1$, $BL_1$, but also contributes to making the entire filter unit 54(IN) compact. Further, the considerably short lengths may also reduce heat generation (copper loss) of the air core coils $AL_1$, $BL_1$ themselves.

Meanwhile, when the coil length H of the air core coils $AL_1$, $BL_1$ is considerably reduced as described above, the cutting-off function of the air core coils $AL_1$, $BL_1$ may be ineffective on a high frequency noise having a low frequency, in particular on the noise of the second high frequency wave LF for ion drawing-in. However, in connection with this point, since the toroidal coils $AL_2$, $BL_2$ are configured to certainly cut off the high frequency noise having such a low frequency at the rear ends of the air core coils $AL_1$, $BL_1$ as described below, the filter function of the entire filter unit 54(IN) is assured.

The first condensers $AC_1$, $BC_1$ are two commercially available terminal-type condensers and are disposed to make a pair laterally in a space between the air core coils $AL_1$, $BL_1$ and the toroidal coils $AL_2$, $BL_2$. In the first condenser $AC_1$ at the first filter 102A side, one terminal is connected to the lower terminal of the air core coil $AL_1$ via a connection conductor 108A and the other terminal is connected to the side wall of the casing 104 via a connection conductor 110A. In the first condenser $BC_1$ of the second filter 102B side, one terminal is connected to the lower terminal of the air core coil $BL_1$ via a connection conductor 108B, and the other terminal is connected to the side wall of the casing 104 via the connection conductor 110B.

As illustrated in FIGS. 4 and 6, the toroidal coils $AL_2$, $BL_2$ are formed by winding a coil conductor of each of them spirally around one half of the periphery of the toroidal core 112 which may be disposed coaxial to the air core coils $AL_1$, $BL_1$. Here, the coil conductors of the two toroidal coils $AL_2$, $BL_2$ are wound in the opposite directions so that respective magnetic fluxes $\Phi_A$, $\Phi_B$ generated in the toroidal core 112 when high frequency currents $I_A$, $I_B$ flow at the same phase are directed in the same direction (added) in the circumferential direction. The toroidal core 112 is made of a core material having a high specific permeability, for example, a Ni—Zn based ferrite and forms an annular closed magnetic path.

In the toroidal coil $AL_2$ at the first filter 102A side, one terminal (the upper terminal) is connected to the lower terminal of the air core coil $AL_1$ via the connection conductor 108A, and the other terminal (the lower terminal) is connected to one end of the second condenser $AC_2$ via a connection conductor 114A. In the toroidal coil $BL_2$ at the second filter 102B side, one terminal (the upper terminal) is connected to the lower terminal of the air core coil $BL_1$ via the connection conductor 108B and the other terminal (the lower terminal) is connected to one terminal of the second condenser $BC_2$ through a connection conductor 114B.

In the present exemplary embodiment, the thickness t of the toroidal core 112 is set largely to be two or more times (preferably, four or more times) the conventional one in order to increase the stray capacity per one turn of the coil windings between the toroidal coils $AL_2$, $BL_2$ and the casing 104. Thus, as illustrated in FIG. 7, a plurality of (e.g., four) commercially available single toroidal cores TC are superposed one on another in the axial direction (vertical direction).

In general, assuming that in a single toroidal core TC, the inner radius is a, the outer radius is b, and the thickness (height) is c, the transversal width of the core body (b−a) is substantially equal to the thickness c and thus, a relation of (b−a) is established. Accordingly, when the single toroidal cores TC are stacked one on another in two tiers, the thickness (height) t of the toroidal core 112 equals to 2c (t=2c), and a relation of t≈2(b−a) is established. In addition, when the single toroidal cores TC are stacked one on another in four tiers as in the illustrated example, the thickness (height) t of the toroidal core 112 equals to 4c (t=4c), a relation of t≈4(b−a) is established. In the present exemplary embodiment, a configuration, in which the thickness t of the toroidal core 112 is set to be large against common sense, is adopted so that a relation of t≥2(b−a), preferably a relation of t≥4(b−a) is established.

Meanwhile, conventional toroidal cores always function as a concentration constant element in the high frequency band. The toroidal coils $AL_2$, $BL_2$ in the present embodiment also function as concentration constant elements in the high frequency band, in particular, for the basic frequency of each of the first high frequency wave HF and the second high frequency wave LF.

In addition, when a core is inserted into a coil, loss of high frequency power, i.e. iron loss is caused. The iron loss in the core material, in particular, hysteresis loss or eddy current loss increases as the frequency increases. In the filter unit 54(IN) in the present exemplary embodiment, since the noise of the first high frequency wave HF having a higher frequency is cut off by the air core coils $AL_1$, $BL_1$ at the first stage, the noise does not enter the toroidal coils $AL_2$, $BL_2$ at the next stage. Thus, the iron loss of the toroidal core 112 is small. Since the loss of the toroidal core 112 is small, the toroidal coils $AL_2$, $BL_2$ may be miniaturized when a core material having a high specific permeability (e.g., ferrite) is used for the toroidal core 112.

The second condensers $AC_2$, $BC_2$ are commercially available two terminal-type condensers, and are disposed in the spaces below the toroidal coils $AL_2$, $BL_2$, respectively, as illustrated in FIG. 4.

An upper connector 118 made of a resin is attached to the top end opening of the casing 104 through an annular cover 116. The top ends of the two air core coils $AL_1$, $BL_1$ are electrically connected to the first and second filter terminals $T_A$, $T_B$ inside or around the upper connector 118. In addition, the bottom end opening of the casing 104 is closed by a bottom plate 120 made of, for example, a resin. Meanwhile, one or both of the cover 116 and the bottom plate 120 of the casing 104 may be an electroconductive plate.

As described above, in the filter unit 54(IN), the air core coils $AL_1$, $BL_1$ are disposed coaxial to the casing 10 at the uppermost part, i.e., at the first stage in the electroconductive casing 104. Below the air core coils $AL_1$, $BL_1$, the toroidal coils $AL_2$, $BL_2$ are disposed coaxial to the casing 10 at the second stage with the first condensers $AC_1$, $BC_1$ being interposed between the toroidal coils $AL_2$, $BL_2$ and the air core coils $AL_1$, $BL_1$, and the second condensers $AC_2$, $BC_2$ are disposed at the lowermost part.

In the above-described layout within the filter unit 54(IN), the air core coils $AL_1$, $BL_1$ are wound at the same winding intervals while progressing to be superposed one on another in the axial direction (vertical direction). Further, the coil length H is considerably shorter than that of a conventional one, thereby forming a compact dual coil assembly. Meanwhile, each of the toroidal coils $AL_2$, $BL_2$ is wound around one half of the periphery of the common toroidal core 112, thereby forming a compact dual coil assembly. In addition, although the toroidal coils $AL_2$, $BL_2$ have a height (thickness) which is increased two times compared to the conventional toroidal coil as described above, the toroidal coils $AL_2$, $BL_2$ are finished with a smaller height size compared to a case where a rod-shaped solenoid coil having the same inductance is disposed vertically.

In addition, the toroidal core 112 of the toroidal coils $AL_2$, $BL_2$ forms an annular closed magnetic path. Further, the toroidal core 112 is disposed coaxial to the air core coils $AL_1$, $BL_1$ positioned thereabove (accordingly, the magnetic fluxes of both sides orthogonally cross). Thus, the electromagnetic mutual influence between the air core coils $AL_1$, $BL_1$ and the toroidal coils $AL_2$, $BL_2$ may be avoided. Accordingly, the separation distance or space between both coils [$AL_1$, $BL_1$], [$AL_2$, $BL_2$] in the axial direction or vertical direction may be formed as small as possible.

As described below, in the filter unit 54(IN), the air core coils $AL_1$ and $BL_1$ are adapted to take charge of the function of cutting off the noise of the first high frequency wave HF having a relatively higher frequency while the toroidal coils $AL_2$, $BL_2$ are adapted to take charge of the function of cutting off the noise of the second high frequency wave LF having a relatively lower frequency. Since the function of cutting off the noise of the first high frequency wave HF and the function of cutting off the noise of the second high frequency wave LF are allotted to the air core coils $AL_1$, $BL_1$ and the toroidal coils $AL_2$, $BL_2$, respectively, it is easy to design, manufacture and adjust the entire filter unit 54(IN), and a machine difference is hardly caused. In addition, since the filter unit 54(IN) may be miniaturized, it is easy to design a layout of various necessary power or function supply systems provided below the susceptor 12 or the chamber 10.

Meanwhile, in the filter unit 54(IN), a layout in which the air core coils $AL_1$, $BL_1$ and the toroidal coils $AL_2$, $BL_2$ are replaced with each other, i.e. a layout in which the toroidal coils $AL_2$, $BL_2$ are disposed at the first stage and the air core coils $AL_1$, $BL_1$ are disposed at the next stage is undesirable. That is, when the toroidal coils $AL_2$, $BL_2$ are disposed at the first state, among the noises of the first high frequency wave HF and the second high frequency wave LF entering the high frequency power feeding lines 100A, 100B from the heating element 40(IN) side, the toroidal coils $AL_2$, $BL_2$ cut off the noise of the second high frequency wave LF having a relatively lower frequency but pass the noise of the first high frequency wave having a higher frequency. In addition, since very small values of capacitances are selected for the first condensers $AC_1$, $BC_1$ as described below, the first condensers $AC_1$, $BC_1$ do not cause the noise of the first high frequency wave HF as well as the noise of the second high frequency wave LF to be released to the earth. Thus, the first noise of the first high frequency wave HF rushes into the toroidal coils $AL_2$, $BL_2$ so that the current of the first high frequency wave HF flows in the toroidal coils $AL_2$, $BL_2$. As a result, a large amount of iron loss is caused in the toroidal core 112 so that the toroidal core 112 generates heat and becomes a high temperature. In addition, when the temperature of the toroidal core 112 is raised to the Curie temperature or higher, the permeability is abruptly reduced, which makes the function of cutting off the noise of the second high frequency wave LF ineffective.

According to the layout in which the air core coils $AL_1$, $BL_1$ are disposed at the first stage and the toroidal coils $AL_2$, $BL_2$ are disposed at the next layout as in the present exemplary embodiment, the air core coils $AL_1$, $BL_1$ cut off the noise of the first high frequency wave HF having a relatively higher frequency. Thus, the noise of the first high frequency wave HF does not rush into the toroidal coils $AL_2$, $BL_2$ at the next stage. Accordingly, the current of the first high frequency wave HF hardly flows in the toroidal coils $AL_2$, $BL_2$ and as a result, the toroidal core 112 does not generate heat to become a high temperature.

[Action of Filter Unit]

Figure 8:
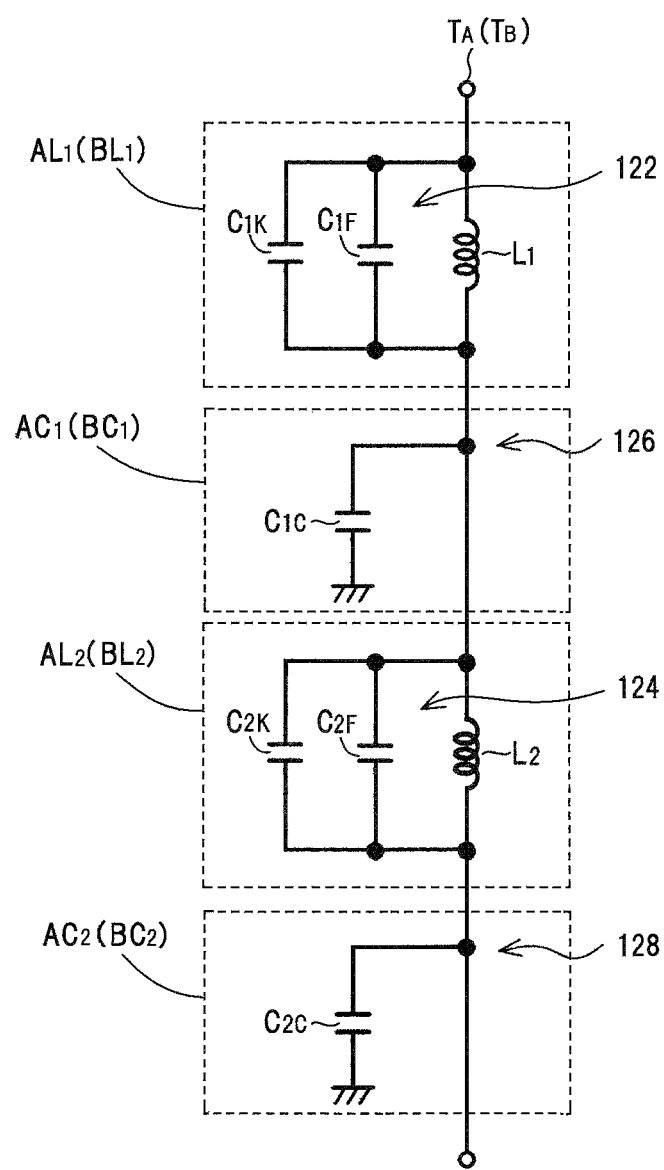
FIG. 8 is a circuit diagram illustrating an equivalent circuit of a filter in the filter unit.

FIG. 8 illustrates an equivalent circuit of the first and second filters 102A, 102B. Based on the layout and wire connection structure within the filter unit 54(IN) as described above, an equivalent circuit of the filter 102A (102B) may be obtained. Meanwhile, the resistance portion of each of the air core coil $AL_1(BL_1)$ and the toroidal coil $AL_2(BL_2)$ is ignored.

The air core coil $AL_1(BL_1)$ not only provides a net inductive element or inductor $L_1$ having an inherent self-inductance, but also includes an inter-coil line capacity $C_{1K}$ generated therearound and a stray capacity $C_{1F}$ (hereinafter referred to as a "ground stray capacity") generated between the air core coil $AL_1(BL_1)$ and the casing 104. In the equivalent circuit, the capacities $C_{1K}$, $C_{1F}$ are connected in parallel to the inductor $L_1$.

Here, the inductance of the inductor $L_1$ in the air core coil $AL_1(BL_1)$ is represented by the following Equation (1).

$$L_1 = k \times \mu_0 \times \pi \times r^2 \times N^2 / H \quad (1)$$

Here, k is a coefficient, $\mu_0$ is permeability in vacuum, r is a radius of the coil, the number of turns, and H is a coil length in the axial direction.

As in Equation (1), the inductance of the inductor $L_1$ is proportional to a square of the number of turns N and inversely proportional to the coil length H. Accordingly, when the coil diameter D (D=2r) remains constant and the coil length H is reduced, the number of turns N is also reduced in the same proportion (that is, the square of the number of turns N is reduced in a larger proportion). Thus, the inductance of the inductor $L_1$ is reduced. In the present exemplary embodiment, the coil length H of the air core coil $AL_1(BL_1)$ is set to be shorter than the coil diameter D and the inductance of the inductor $L_1$ is set to be low (e.g., 5 µH or less), as described above.

The capacitance of the inter-coil line capacity $C_{1K}$ depends on the winding interval (pitch) of the coil $AL_1$ ($BL_1$), but not depends on the number of turns N or the coil length H. Meanwhile, the capacitance of the ground stray capacity $C_{1F}$ depends on the separation distance from the casing 104, and the entire area of the coil surface facing the casing 104. Accordingly, in the air core coil $AL_1(BL_1)$, the inductance of the inductor $L_1$ is reduced and the capacitance of the ground stray capacity $C_{1F}$ is also reduced as the coil length H is reduced (the number of turns N is reduced) as long as the coil diameter D and the diameter of the casing 104 remain constant.

However, since in the air core coil $AL_1(BL_1)$, the area of the coil surface per one turn is small, the capacitance of the ground stray capacity $C_{1F}$ is not changed significantly even if the coil length H is changed, and is merely placed on the same level with that of the inter-coil line capacity $C_{1K}$ (e.g., several pF).

When the inductance of the inductor $L_1$ in the air core coil $AL_1(BL_1)$ is low while the capacitance of the ground stray capacity $C_{1F}$ is small substantially on the same level with the capacitance of the inter-coil line capacity $C_{1K}$, as described above, it is advantageous (favorable) in setting the self-resonance frequency of the air core coil $AL_1(BL_1)$, i.e. the first parallel resonance frequency $f_{PH}$ given from a first parallel resonance circuit 122 (to be described later) in a considerably high frequency region.

Meanwhile, the toroidal coil $AL_2(BL_2)$ not only provides a net inductive element or inductor $L_2$ having an intrinsic self-inductance, but also has an inter-coil line capacity $C_{2K}$ generated therearound and a ground stray capacity $C_{2F}$ generated between the toroidal coil $AL_2(BL_2)$ and the casing 104. In the equivalent circuit, the capacities $C_{2K}$, $C_{2F}$ are connected in parallel to the inductor $L_2$.

Here, the inductance of the inductor $L_2$ in the toroidal coil $AL_2(BL_2)$ is represented by the following Equation (2).

$$L_2 = N^2 \times \mu \times t \times \ln(b/a) / 2\pi \quad (2)$$

Here, N is the number of turns, µ is permeability, t is a thickness (height), and a is an inner radius, and b is an outer radius.

In the present exemplary embodiment, a core material having a high specific permeability (e.g., ferrite) is used for the toroidal core 112 as described above. In addition, as described above, when the thickness (height) t of the toroidal core 112 is set largely to be two or more times (preferably, four or more times) the conventional one and the number of turns N is selected to be somewhat larger, the inductance of the inductor $L_2$ may be set to a considerably high value (e.g., 100 µH or higher).

The capacitance of the inter-coil line capacity $C_{2K}$ depends on the winding interval (pitch) of the coil $AL_2$ ($BL_2$), but does not depend on the number of turns N. Meanwhile, the capacitance of the ground stray capacity $C_{2F}$ depends on the separation distance from the casing 104, and the entire area of the coil surface facing the casing 104. Accordingly, in the toroidal coil $AL_2(BL_2)$, as the number of turns of the coils increases, the inductance of the inductor $L_2$ increases and the capacitance of the ground stray capacity $C_{2F}$ also increases, as long as the diameter of the casing 104 and the size of the toroidal core 112 remain constant.

In particular, the toroidal core 112 having a large thickness (height) t obtained by stacking a plurality of single toroidal cores TC one on another as described above has a large surface area per one turn of the coil. Thus, the capacitance of the ground stray capacity $C_{2F}$ is very large and may become four or five times the inter-coil line capacity $C_{2K}$ or even more (e.g., 20 pF or more).

When the inductance of the inductor $L_2$ in the air core coil $AL_2(BL_2)$ is low while the capacitance of the ground stray capacity $C_{1F}$ is considerably larger than the capacitance of the inter-coil line capacity $C_{2K}$, as described above, it is advantageous (favorable) in setting the self-resonance frequency of the air core coil $AL_2(BL_2)$, i.e. the first parallel resonance frequency $f_{PL}$ given from a second parallel resonance circuit 124 (to be described later) in a considerably low frequency region.

In particular, the first condenser $AC_1(BC_1)$ and the second condenser $AC_2(BC_2)$ do not have both a parasitic capacity and a stray capacity, and function as first and second capacitors $C_{1C}$, $C_{2C}$ having capacitances according to specifications in the equivalent circuit. As described below, in the frequency-impedance characteristic of the filter 102A (102B), the capacitance of the first capacitor $C_{1C}$ is selected such that a first serial resonance frequency $f_{SH}$ can be obtained properly in the middle of the second parallel resonance frequency $f_{PL}$ and the first parallel resonance frequency $f_{PH}$, and the capacitance of the second capacitor $C_{2C}$ is selected such that a second serial resonance frequency $f_{SL}$ can be obtained in a frequency band considerably lower than the second parallel resonance frequency $f_{PL}$.

In the equivalent circuit of the filter 102A(102B) as described above, the first parallel resonance circuit 122 having the first parallel resonance frequency $f_{PH}$ coinciding with or near to the basic frequency of the first frequency wave HF is formed by the inductor $L_1$, the inter-coil line capacity $C_{1K}$ and the ground stray capacity $C_{1F}$ of the air core coil $AL_1(BL_1)$. Here, the first parallel resonance frequency $f_{PH}$ is also the self-resonance frequency of the air core coil $AL_1(BL_1)$, and is represented by the following Equation (3).

$$f_{PH} = 1/2\pi\sqrt{L_1(C_{1K}+C_{1F})} \quad (3)$$

In addition, the second parallel resonance circuit 124 having the second parallel resonance frequency $f_{PL}$ coinciding with or near to the basic frequency of the second high frequency wave LF is formed by the inductor $L_2$, the inter-coil line capacity $C_{2K}$, and the ground stray capacity $C_{2F}$ of the toroidal coil $AL_2(BL_2)$. Here, the second parallel resonance frequency $f_{PL}$ is also the self-resonance frequency of the toroidal coil $AL_2(BL_2)$, and is represented by the following Equation (4).

$$f_{PL} = 1/2\pi\sqrt{L_2(C_{2K}+C_{2F})} \quad (4)$$

In addition, a first serial resonance circuit 126 having the first serial resonance frequency $f_{SH}$ between the second parallel resonance frequency $f_{PL}$ and the first parallel resonance frequency $f_{PH}$ is formed by the inductor $L_1$ of the air core coil $AL_1(BL_1)$, the first condenser $AC_1(BC_1)$, i.e. the first capacitor $C_{1C}$, the inductor $L_2$, the inter-coil line capacity $C_{2K}$, and the ground stray capacity $C_{2F}$ of the toroidal coil $AL_2(BL_2)$, and the second condenser $AC_2$ ($BC_2$), i.e. the second capacitor $C_{2C}$.

In addition, a second serial resonance circuit 128 having the second serial resonance frequency $f_{SL}$ lower than the basic frequency of the second high frequency wave LF is formed by the inductor $L_2$ of the toroidal coil $AL_2(BL_2)$ and the second condenser $AC_2(BC_2)$, i.e. the second capacitor $C_{2C}$.

Figure 9:
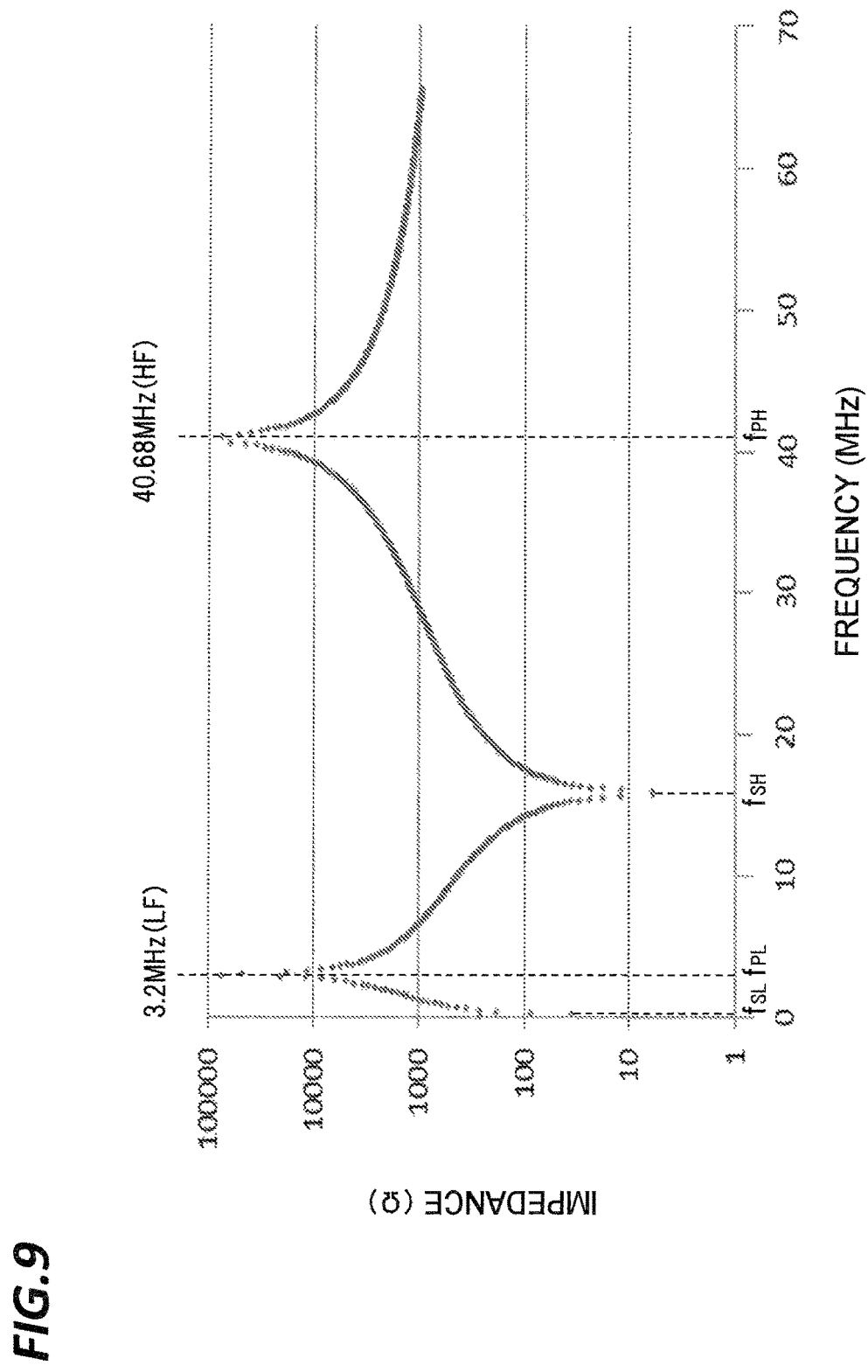
FIG. 9 is a view illustrating an exemplary frequency-impedance characteristic of the filter in the filter unit.

FIG. 9 illustrates an exemplary frequency-impedance characteristic obtained by the filter 102A(102B) configured as described above in the case where the basic frequency of the first high frequency wave HF is 40.68 MHz and the basic frequency of the second high frequency wave LF is 3.2 MHz in the plasma processing apparatus of the present exemplary embodiment.

In the illustrated frequency-impedance characteristic, the first parallel resonance frequency $f_{PH}$ is made to coincide with the basic frequency 40.68 MHz of the first high frequency wave HF which may be easily implemented. That is, as described above, when the number of turns N or the coil length H of the air core coil $AL_1(BL_1)$ is varied, the inductance of the inductor $L_1$ and the capacitance of the ground stray capacity $C_{1F}$ are varied in the same direction according to the variation of the coil length H (the number of turns N), and the first parallel resonance frequency $f_{PH}$ is varied monotonously by Equation (3) described above, although the capacitance of the inter-coil line capacity $C_{1K}$ is not varied. Accordingly, when the number of turns N or the coil length H of the air core coil $AL_1(BL_1)$ is adjusted, the first parallel resonance frequency $f_{PH}$ may be made to coincide with the basic frequency (40.68 MHz) of the first high frequency wave HF.

In addition, in the illustrated frequency-impedance characteristic, the second parallel resonance frequency $f_{PL}$ is made to coincide with the basic frequency (3.2 MHz) of the second high frequency wave LF which may also be easily implemented. That is, as described above, when the number of turns of the toroidal coil $AL_2(BL_2)$ is varied, the inductance of the inductor $L_2$ and the capacitance of the ground stray capacity $C_{2F}$ are varied in the same direction according to the variation of the number of turns N and the second parallel resonance frequency $f_{PL}$ is varied monotonously by Equation (4) described above, although the capacitance of the inter-coil line capacity $C_{2K}$ is not varied. In addition, when the number of stacked single toroidal cores TC that form the toroidal core 112 is varied, the inductance of the inductor $L_2$ and the capacitance of the ground stray capacity $C_{2F}$ are varied in a large step in the same direction and the second parallel resonance frequency $f_{PL}$ is varied stepwise by Equation (4) described above. Accordingly, when a rough adjustment is performed, the second parallel resonance frequency $f_{PL}$ may be made to coincide with the basic frequency (3.2 MHz) of the second high frequency wave LF by varying the number of stacked single cores TC that form the toroidal core 112. When a fine adjustment is performed, the second parallel resonance frequency $f_{PL}$ may be made to coincide with the basic frequency (3.2 MHz) of the second high frequency wave LF by varying the number of turns N of the toroidal coil $AL_2(BL_2)$.

In the present exemplary embodiment, however, when the first serial resonance frequency $f_{SH}$ is set to be properly in the middle of the second parallel resonance frequency $f_{PL}$ and the first parallel resonance frequency $f_{PH}$ (e.g., 15 MHz to 20 MHz) and the second serial resonance frequency $f_{SL}$ is to be in a frequency region considerably lower than the second parallel resonance frequency $f_{PL}$ (e.g., 200 MHz to 400 Hz), the characteristic in the vicinity of each parallel resonance point may be smoothed (broadened). Thus, even if the first parallel resonance frequency $f_{PH}$ is somewhat deviated from the basic frequency (40.68 MHz) of the first high frequency wave HF (deviated about ±5 MHz in the illustrated example), a sufficiently high impedance may be applied to the noise of the first high frequency wave HF. In addition, even if the second parallel resonance frequency $f_{PL}$ is somewhat deviated from the basic frequency (3.2 MHz) of the second high frequency wave (LF) (deviated about ±1 MHz in the illustrated example), a sufficiently high impedance may be applied to the noise of the second high frequency wave LF.

When the characteristic in the vicinity of each of the first and second parallel resonance frequencies $f_{PH}$, $f_{PL}$ is smoothened (broadened) in the frequency-impedance characteristic of the filter 102A(102B) as described above, a range in the vicinity of a parallel resonance frequency (proximity range) may be extended in which a sufficiently high impedance or cutting-off function can be obtained in relation to each of the noises of the first high frequency wave HF and the second high frequency wave LF.

In a specific procedure, the second serial resonance frequency $f_{SL}$ is set to a desired value considerably lower than the second parallel resonance frequency $f_{PL}$ by selecting a proper value (e.g., 4000 pF or more) as the capacitance of the second condenser $AC_2(BC_2)$ or adjusting the capacitance of the second condenser $AC_2(BC_2)$ to the proper value after the first parallel resonance frequency $f_{PH}$ and the second parallel resonance frequency $f_{PL}$ have been determined in the manner described above.

In addition, the first serial resonance frequency $f_{SH}$ is set to a suitable value between the second parallel resonance frequency $f_{PL}$ and the first parallel resonance frequency $f_{PH}$, by selecting a proper value (e.g., 20 pF or less) as the capacitance of the first condenser $AC_1(BC_1)$ or adjusting the capacitance of the first condenser $AC_1(BC_1)$ to the proper value after the second serial resonance frequency $f_{SL}$ has been determined in the manner described above.

Meanwhile, in order to obtain a broad characteristic which is symmetrical in the front and back direction with reference to each of the second parallel resonance frequency $f_{PL}$ and the first parallel resonance frequency $f_{PH}$ in the frequency-impedance characteristic of the filter 102A(102B), the first serial resonance frequency $f_{SH}$ may be set to a value somewhat nearer to the second parallel resonance frequency $f_{PL}$ (about 17 MHz), rather than a value nearer to the center (about 21.9 MHz) between the second parallel resonance frequency $f_{PL}$ (3.2 MHz) and the first parallel resonance frequency $f_{PH}$ (40.68 MHz), as illustrated in FIG. 9.

As described above, in the filter 102A(102B) of the present exemplary embodiment, the air core coil $AL_1(BL_1)$ at the first stage which has a self-resonance frequency $f_{PH}$ coinciding with or near to the basic frequency of the first high frequency wave HF exerts a filter's cutting-off function with a sufficiently high impedance on the noise of the first high frequency wave HF having a relatively frequency and entering the heater power feeding line 102A(102B) from the heating element 40 inside the susceptor 12, and passes the noise of the second high frequency wave LF having a relatively low frequency and entering the heater power feeding line 102A(102B) together with the noise of the first high wave frequency HF. In addition, the toroidal coil $AL_2(BL_2)$ at the next stage which has a self-resonance frequency $f_{PL}$ coinciding with or near to the basic frequency of the second high frequency wave LF exerts a filter's cutting-off function with a sufficiently high impedance on the noise of the second high frequency wave LF that has passed through the air core coil $AL_1(BL_1)$ of the first stage. The self-resonance frequency $f_{PH}$ of the air core coil $AL_1(BL_1)$ and the self-resonance frequency $f_{PL}$ of the toroidal coil $AL_2(BL_2)$ are independent from each other and can be independently adjusted in each coil, as described above.

Second Exemplary Embodiment

Figure 10:
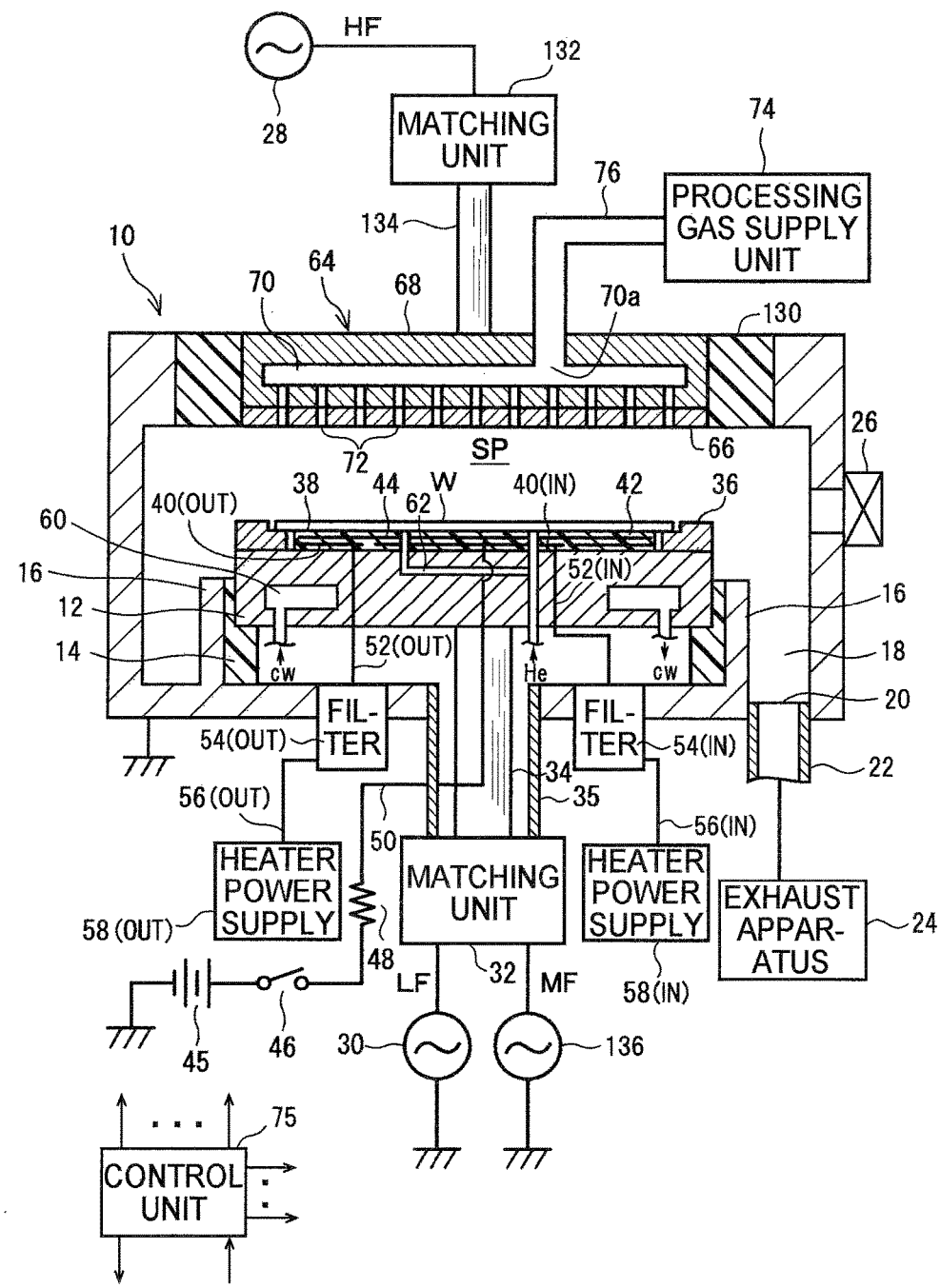
FIG. 10 is a cross-sectional view illustrating an entire configuration of a plasma processing apparatus according to a second exemplary embodiment.

FIG. 10 illustrates a configuration of a plasma processing apparatus of a second exemplary embodiment. In the drawing, the components having the same configuration or function as those of the plasma processing apparatus of the first exemplary embodiment described above (FIG. 1) will be given the same symbols.

The plasma processing apparatus is configured as a capacitively coupled plasma etching apparatus of lower pat two-frequency/upper part one-frequency application type. This plasma etching apparatus has a main feature different from the plasma etching apparatus of the first exemplary embodiment described above (FIG. 1) in that a first high frequency wave HF for plasma generation is applied to an upper electrode 64, and second and third high frequency waves LF, MF having different frequencies are applied to the susceptor 12 in a superposed state so as to variously control the energy (bias) of ions drawn in a semiconductor wafer W in a more flexible manner. Here, the frequency of the third frequency wave MF is selected to a value (e.g., 12.88 MHz) higher than the frequency (e.g., 3.2 MHz) of the second high frequency wave LF.

In the plasma etching apparatus of the present exemplary embodiment, the upper electrode 64 is attached to the top of the chamber 10 through a ring-shaped insulator 130. A first high frequency power supply 28 is electrically connected to the upper electrode 64 via a matching unit 132 and an upper power feeding rod 134 to output a first high frequency wave for plasma generation. In addition, second and third high frequency power supplies 36, 136 are electrically connected to the susceptor 12 via a matcher (not illustrated) within a matching unit 32 and a lower power feeding rod 34 to output second and third high frequency waves LF, MF for ion drawing-in, respectively. A control unit 75 is configured to control the total power and power ratio of the second and third high frequency waves LF, MF output from the high frequency power supply 36, 136, according to etching processing specifications, conditions or recipes.

Figure 11:
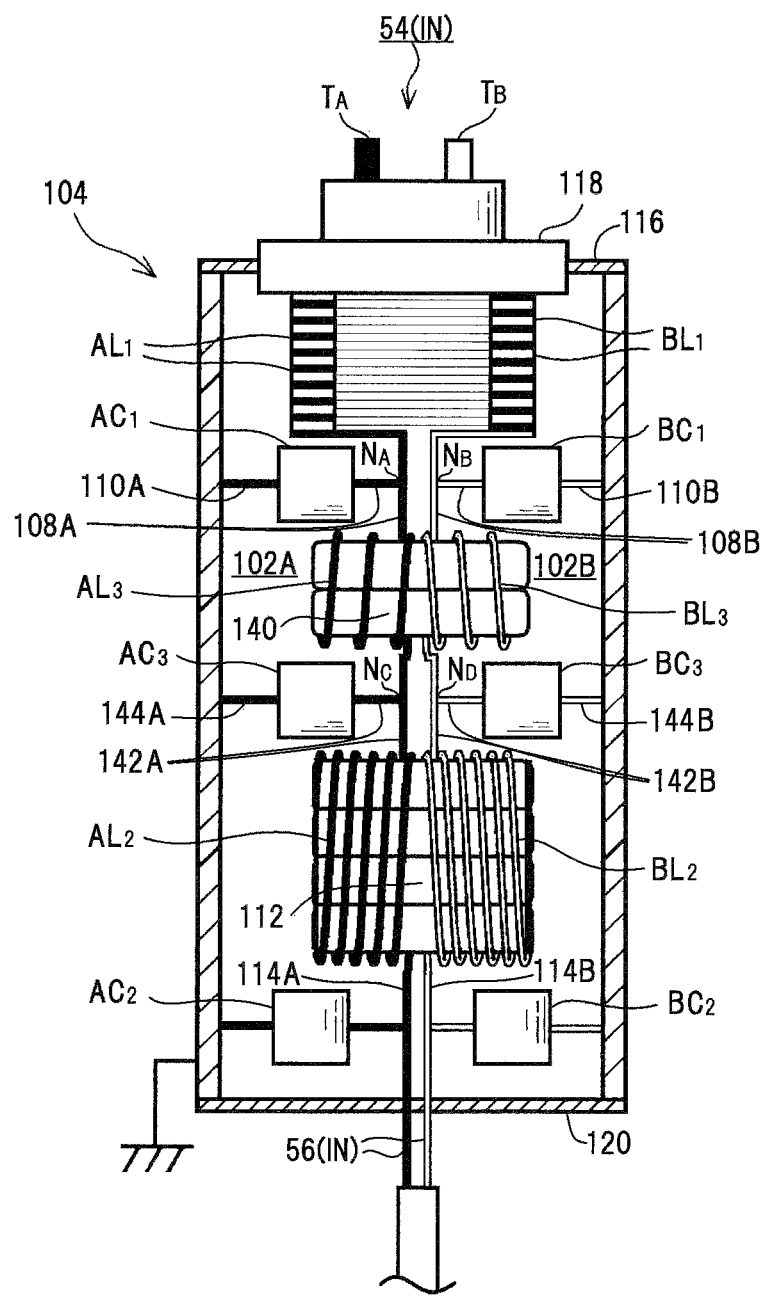
FIG. 11 is a vertical cross-sectional view illustrating a physical structure of the filter unit in the second exemplary embodiment.

In the present exemplary embodiment, the layout and wire connection of a filter 102A(102B) are configured as illustrated in FIG. 11 in order to handle the lower part two-frequency/upper-part one-frequency application system described above.

In FIG. 11, more specifically, an air core coil $AL_1(BL_1)$, a first condenser $AC_1(BC_1)$, an upper toroidal coil $AL_3(BL_3)$, a third condenser $AC_3(BC_3)$, a lower toroidal coil $AL_2(BL_2)$, and a second condenser $AC_2(BC_2)$ are arranged in this order from the top within a grounded electroconductive casing 104.

The filter 102A(102B) is different from that of the first exemplary embodiment (FIG. 4) in configuration in that the upper toroidal coil $AL_3(BL_3)$ and the third condenser $AC_3(BC_3)$ are added or additionally installed between the first condenser $AC_1(BC_1)$ and the toroidal coil $AL_2(BL_2)$. The configurations and functions of other reactance elements are substantially the same as those of the first exemplary embodiment.

The upper toroidal coils $AL_3$, $BL_3$ are formed by winding a coil conductor of each of them spirally around about one half of the periphery of the toroidal core 142 which may be disposed coaxial to the casing 104. Here, the coil conductors of the two toroidal coils $AL_3$, $BL_3$ are wound in the opposite directions so that respective magnetic fluxes generated in the toroidal core 140 when the high frequency currents flow at the same phase are directed in the same direction (added) in the circumferential direction. The toroidal core 140 is made of a core material having a high specific permeability, for example, a Ni—Zn based ferrite, and forms an annular closed magnetic path.

The upper toroidal coil $AL_3$ at the first filter 102A side includes one terminal (upper terminal) connected to the lower terminal of the air core coil $AL_1$ via a connection conductor 108A (connection point $N_A$) and the other terminal (lower terminal) connected to the upper terminal of the lower toroidal coil $AL_2$ via the connection conductor 142A (connection point NO. In the upper toroidal coil $BL_3$ at the second filter 102B side, one terminal (upper terminal) is connected to the lower terminal of the air core coil $BL_1$ via the connection conductor 108B (connection point $N_B$) and the other terminal (lower terminal) is connected to the upper terminal of the lower toroidal coil $BL_2$ via a connection conductor 142B (connection point $N_D$).

In the second exemplary embodiment, in order to make the self-resonance frequency $f_{PM}$ of the upper toroidal coil $AL_3(BL_3)$ correspond or approximate to the frequency of the third high frequency wave MF, the thickness t of the upper toroidal core $AL_3(BL_3)$ is set to be smaller than the thickness t of the lower toroidal core $AL_2$ ($BL_2$), and, for example, two single toroidal cores TC are stacked one on another in the axial direction (in the vertical direction). In addition, the number of turns N of the upper toroidal coil $AL_3(BL_3)$ is smaller than the number of turns N of the lower toroidal cores $AL_2(BL_2)$.

The third condensers $AC_3$, $BC_3$ are commercially available two-terminal type condensers, and are disposed to make a pair laterally in the space between the upper toroidal coils $AL_3$, $BL_3$ and the lower toroidal coils $AL_2$, $BL_2$. In the third condenser $AC_3$ at the first filter 102A side, one terminal is connected to the lower terminal of the upper toroidal coil $AL_3$ and the upper terminal of the lower toroidal coil $AL_2$ via a connection conductor 142A (connection point NO and the other terminal is connected to the side wall of the casing 104 via a connection conductor 144A. In the third condenser $BC_3$ at the second filter 102B side, one terminal is connected to the lower terminal of the upper toroidal coil $BL_3$ and the upper terminal of the lower toroidal coil $BL_2$ via a connection conductor 142B (connection point $N_D$), and the other terminal is connected to the side wall of the casing 104 via a connection conductor 144B.

Figure 12:
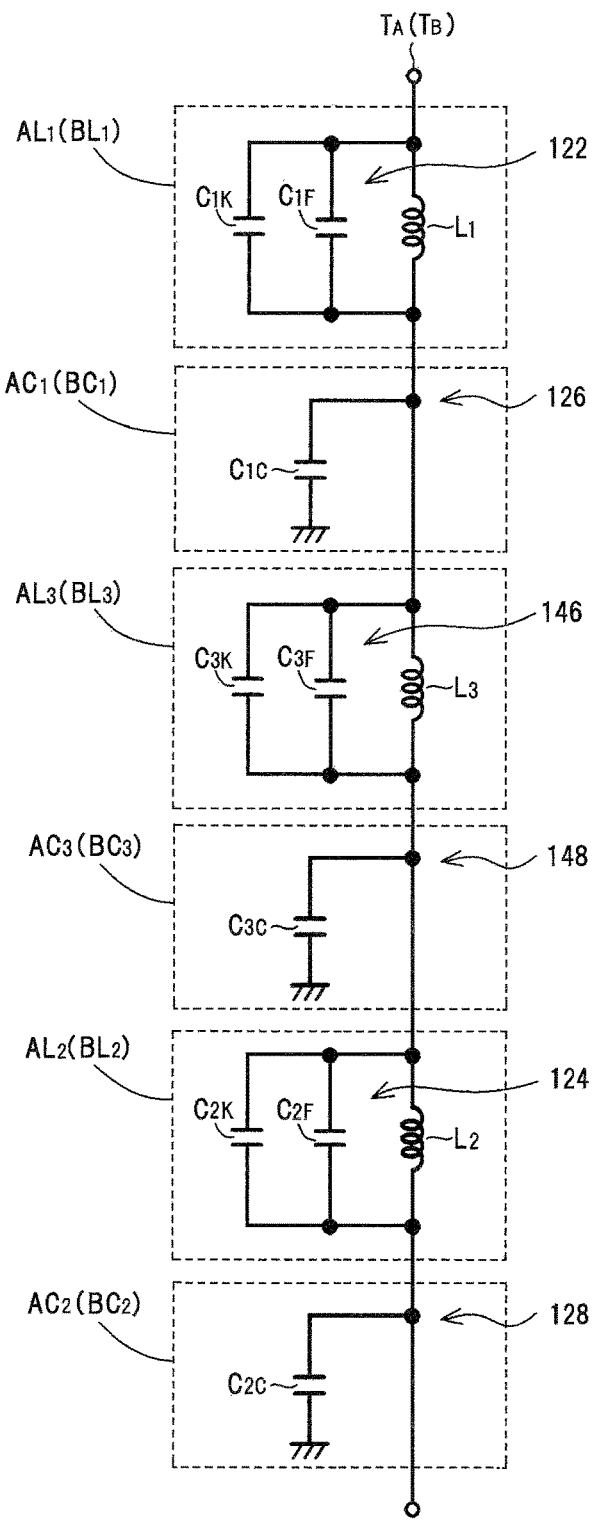
FIG. 12 is a circuit diagram illustrating an equivalent of a filter in the filter unit of FIG. 11.

FIG. 12 illustrates an equivalent circuit of the first and second filters 102A, 102B in the second exemplary embodiment. In the equivalent circuit, a first parallel resonance circuit 122 having a first parallel resonance frequency $f_{PH}$ coinciding with or near to the basic frequency of the first high frequency wave HF is formed by the inductor $L_1$, the inter-coil line capacity $C_m$ and the ground stray capacity $C_{1F}$ of the air core coil $AL_1(BL_1)$, as in the first exemplary embodiment.

In addition, a third parallel resonance circuit 146 having a third parallel resonance frequency $f_{PM}$ coinciding with or near to the basic frequency of the third high frequency wave MF is formed by the inductor $L_3$, the inter-coil line capacity $C_{3K}$, and the ground stray capacity $C_{3F}$ of the upper toroidal coil $AL_3(BL_3)$. Here, the third parallel resonance frequency $f_{PM}$ is also the self-resonance frequency of the upper toroidal coil $AL_3(BL_3)$ and is represented by the following Equation (5).

$$f_{PM}=1/2\pi\sqrt{L_3(C_{3K}\pm C_{3F})} \quad (5)$$

In addition, as in the first exemplary embodiment, a second parallel resonance circuit 124 having a second parallel resonance frequency $f_{PL}$ coinciding with or near to the basic frequency of the second high-frequency wave LF is formed by the inductor $L_2$, the inter-coil line capacity $C_{2K}$, and the ground stray capacity $C_{2F}$ of the lower toroidal coil $AL_2(BL_2)$.

In addition, a first serial resonance circuit 126 having a first serial resonance frequency $f_{SH}$ between the third parallel resonance frequency $f_{PM}$ and the first parallel resonance frequency $f_{PH}$ is formed by the inductor $L_1$ of the air core coil $AL_1(BL_1)$, the first condenser $AC_1(BC_1)$, i.e. the first capacitor $C_{1C}$, the inductor L3, the inter-coil line capacity $C_{3K}$ and the ground stray capacity $C_{3F}$ of the upper toroidal coil $AL_3(BL_3)$, the third condenser $AC_3(BC_3)$, i.e. the third capacitor $C_{3C}$, the inductor $L_2$, the inter-coil line capacity $C_{2K}$ and the ground stray capacity $C_{2F}$ of the lower toroidal coil $AL_2(BL_2)$, and the second condenser $AC_2(BC_2)$, i.e. the second capacitor $C_{2C}$.

Further, a second serial resonance circuit 148 having a third serial resonance frequency $f_{SM}$ between the second parallel resonance frequency $f_{PL}$ and the third parallel resonance frequency $f_{PM}$ is formed by the inductor $L_3$ of the upper toroidal coil $AL_3(BL_3)$, the third condenser $AC_3(BC_3)$, i.e. the third capacitor $C_{3C}$, the inductor $L_3$, the inter-coil line capacity $C_{3K}$, and the ground stray capacity $C_{3F}$ of the lower toroidal coil $AL_2(BL_2)$, and the second condenser $AC_2(BC_2)$, i.e. the second capacitor $C_{2C}$.

Moreover, a second serial resonance circuit 128 having a second serial resonance frequency $f_{SL}$ lower than the second basic frequency of the second high frequency wave LF is formed by the inductor $L_2$ of the lower toroidal coil $AL_2(BL_2)$ and the second condenser $AC_2(BC_2)$, i.e. the second capacitor $C_{2C}$.

Figure 13:
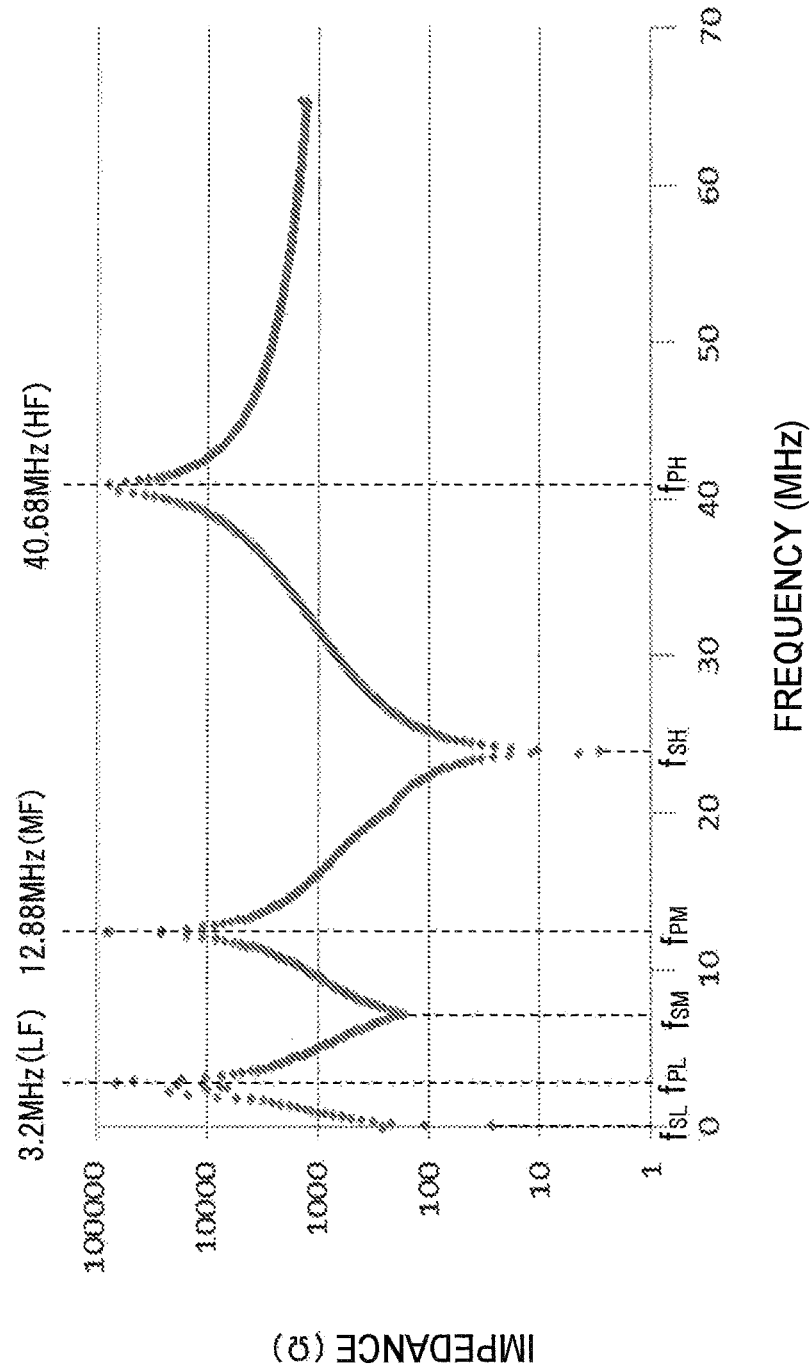
FIG. 13 is a view illustrating an exemplary frequency-impedance characteristic of the filter in the filter unit of FIG. 11.

FIG. 13 illustrates an exemplary frequency-impedance characteristic obtained by the filter 102A(102B) when the frequency of the first high frequency wave is 40.68 MHz, the frequency of the second high frequency wave LF is 3.2 MHz, and the frequency of the third high frequency wave MF is 12.88 MHz in the plasma processing apparatus of the present exemplary embodiment.

As in the first exemplary embodiment, the first parallel resonance frequency $f_{PH}$ may be made to coincide with the basic frequency (40.68 MHz) of the first high frequency wave HF by adjusting the number of turns N or the coil length H of the air core coil $AL_1$ ($BL_1$).

In addition, when a rough adjustment is performed, the third parallel resonance frequency $f_{PM}$ may be made to coincide with the basic frequency (12.88 MHz) of the third high frequency wave MF by varying the number of stacked single cores TC that form the toroidal core 140. When a fine adjustment is performed, the second parallel resonance frequency $f_{PM}$ may be made to coincide with the basic frequency (12.88 MHz) of the third high frequency wave MF by varying the number of turns N of the toroidal coil $AL_3(BL_3)$.

Further, when the rough adjustment is performed, the second parallel resonance frequency $f_{PL}$ may be made to coincide with the basic frequency (3.2 MHz) of the second high frequency wave LF by varying the number of stacked single cores TC that form the toroidal core 122. When the fine adjustment is performed, the second parallel resonance frequency $f_{PL}$ may be made to coincide with the basic frequency (3.2 MHz) of the second high frequency wave LF by varying the number of turns N of the lower toroidal coil $AL_2(BL_2)$.

In the present exemplary embodiment, when the first serial resonance frequency $f_{SH}$ is set to be properly in the middle of the third parallel resonance frequency $f_{PM}$ and the first parallel resonance frequency $f_{PH}$ (e.g., 22 MHz to 25 MHz), the third serial resonance frequency $f_{SM}$ is set to be properly in the middle of the second parallel resonance frequency $f_{PL}$ and the third parallel resonance frequency $f_{PM}$, and the second serial resonance frequency $f_{SL}$ is set to be in a frequency region considerably lower than the second parallel resonance frequency $f_{PL}$ (e.g., 200 MHz to 400 Hz), the characteristic in the vicinity of each parallel resonance point may be smoothed (broadened). Thus, even if the first parallel resonance frequency $f_{PH}$ is somewhat deviated from the basic frequency (40.68 MHz) of the first high frequency wave HF (even if deviated about ±5 MHz in the illustrated example), a sufficiently high impedance may be applied to the noise of the first high frequency wave HF. In addition, even if the third parallel resonance frequency $f_{PM}$ is somewhat deviated from the basic frequency (12.88 MHz) of the third high frequency wave (MF) (even if deviated about ±2 MHz in the illustrated example), a sufficiently high impedance may be applied to the noise of the third high frequency wave MF. Further, even if the second parallel resonance frequency $f_{PL}$ is somewhat deviated from the basic frequency (3.2 MHz) of the second high frequency wave LF (even if deviated about ±1 MHz in the illustrated example), a sufficiently high impedance may be applied to the noise of the second high frequency wave LF.

When the characteristic in the vicinity of each of the first, second and third parallel resonance frequencies $f_{PL}$, $f_{PL}$, $f_{PM}$ is smoothened (broadened) in the frequency-impedance characteristic of the filter 102A(102B) as described above, a range in the vicinity of a parallel resonance frequency (proximity range) may be extended in which a sufficiently high impedance or cutting-off function can be obtained in relation to each of the noises of the first high frequency wave HF, the second high frequency wave LF, and the third high frequency wave MF.

As described above, when a frequency-impedance characteristic in the vicinity of each parallel resonance point is smoothened (broadened), a range in the vicinity of a parallel resonance frequency (proximity range) may be extended in which a sufficiently high impedance or cutting-off function can be obtained in relation to each of the noises of the first high frequency wave HF, the second high frequency wave LF and the third high frequency wave MF.

In a specific procedure, the second serial resonance frequency $f_{SL}$ is set to a desired value considerably lower than the second parallel resonance frequency $f_{PL}$ by selecting a proper value (e.g., 4000 pF or more) as the capacitance of the second condenser $AC_2(BC_2)$ or adjusting the capacitance of the second condenser $AC_2(BC_2)$ to the proper value after all the parallel resonance frequencies $f_{PL}$, $f_{PM}$, $f_{PH}$ have been determined in the manner described above.

In addition, the first serial resonance frequency $f_{SH}$ is set to a proper middle of the second parallel resonance frequency $f_{PL}$ and the third parallel resonance frequency $f_{PM}$, by selecting a proper value (e.g., 30 pF to 60 pF) as the capacitance of the third condenser $AC_3(BC_3)$ or adjusting the capacitance of the third condenser $AC_3(BC_3)$ to the proper value after the second serial resonance frequency $f_{SL}$ has been determined in the manner described above.

Further, the first serial resonance frequency $f_{SH}$ is set to a proper middle of the third parallel resonance frequency $f_{PM}$ and the first parallel resonance frequency $f_{PH}$, by selecting a proper value (e.g., 10 pF or less) as the capacitance of the first condenser $AC_1(BC_1)$ or adjusting the capacitance of the first condenser $AC_1(BC_1)$ to the proper value after the third serial resonance frequency $f_{SM}$ has been determined in the manner described above.

Meanwhile, in order to obtain a broad characteristic which is symmetrical in the front and back direction with reference to each of the second parallel resonance frequency $f_{PL}$ and the third parallel resonance frequency $f_{PM}$ in the frequency-impedance characteristic of the filter 102A(102B), the third serial resonance frequency $f_{SM}$ may be set to a value near to the middle (8 MHz) of the second parallel resonance frequency $f_{PL}$ (3.2 MHz) and the third parallel resonance frequency $f_{PM}$ (12.88 MHz), as illustrated in FIG. 13.

In addition, in order to obtain a broad characteristic which is symmetrical in the front and back direction with reference to each of the third parallel resonance frequency $f_{PM}$ and the first parallel resonance frequency $f_{PH}$, the first serial resonance frequency $f_{SH}$ may be set to a value somewhat nearer to the third parallel resonance frequency $f_{PM}$ (23 MHz), rather than to a value near to the middle (26.8 MHz) of the third parallel resonance frequency $f_{PM}$ (12.88 MHz) and the first parallel resonance frequency $f_{PH}$ (40.68 MHz), as illustrated in FIG. 13.

As described above, in the filter 102A(102B) of the present exemplary embodiment, the air core coil $AL_1(BL_1)$ at the first stage which has a self-resonance frequency $f_{PH}$ coinciding with or near to the basic frequency of the first high frequency wave HF exerts a filter's cutting-off function with a sufficiently high impedance on the noise of the first high frequency wave HF entering the heater power feeding line 102A(102B) from the heating element 40(IN) inside the susceptor 12, and passes the noises of the third high frequency wave MF and the second high frequency wave LF entering the heater power feeding line 102A(102B) together with the noise of the first high wave frequency HF. In addition, the toroidal coil $AL_2(BL_2)$ at the next stage which has a self-resonance frequency $f_{PL}$ coinciding with or near to the basic frequency of the second high frequency wave LF exerts a filter's cutting-off function with a sufficiently high impedance on the noise of the second high frequency wave LF that has passed through the upper toroidal coil $AL_3(BL_3)$.

The self-resonance frequency $f_{PH}$ of the air core coil $AL_1(BL_1)$, the self-resonance frequency $f_{PM}$ of the upper toroidal coil $AL_3(BL_3)$ and the self-resonance frequency $f_{PL}$ of the lower toroidal coil $AL_2(BL_2)$ are independent from each other and can be independently adjusted in each coil, as described above.

In the present exemplary embodiment, a filter's cutting-off function with a sufficiently high impedance may be exerted on any of the noises of the first, second and third high frequency waves HF, LF, MF entering the heater power feeding line from the inner heating element 40(IN) inside the susceptor 12 and the outer heating element 40(OUT) during a plasma processing, in an efficient, stable and reliable manner, with low power consumption. Thus, in the plasma etching apparatus in the present exemplary embodiment, the heater-type wafer temperature control function can be improved, leakage of power of the first and second high frequency waves HF, LF to the heater power feeding line from the chamber 10 can be efficiently prevented or reduced so that the reproducibility and reliability of the plasm process can be improved.

Meanwhile, as a modified example of the second exemplary embodiment described above, the first high frequency power supply 28 for plasma generation may be connected to the susceptor 12 so as to configure the plasma etching apparatus as a lower part three-frequency application type plasma etching apparatus.

Third Exemplary Embodiment

Figure 14:
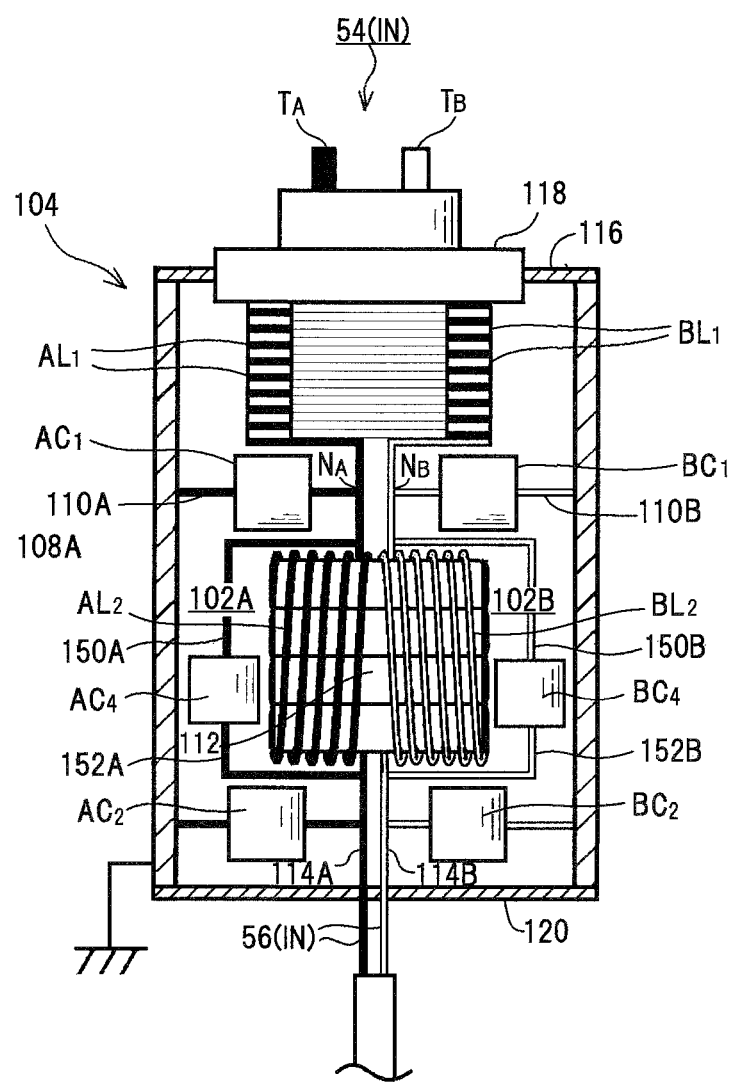
FIG. 14 is a vertical cross-sectional view illustrating a physical structure of the filter unit in a third exemplary embodiment.
Figure 15:
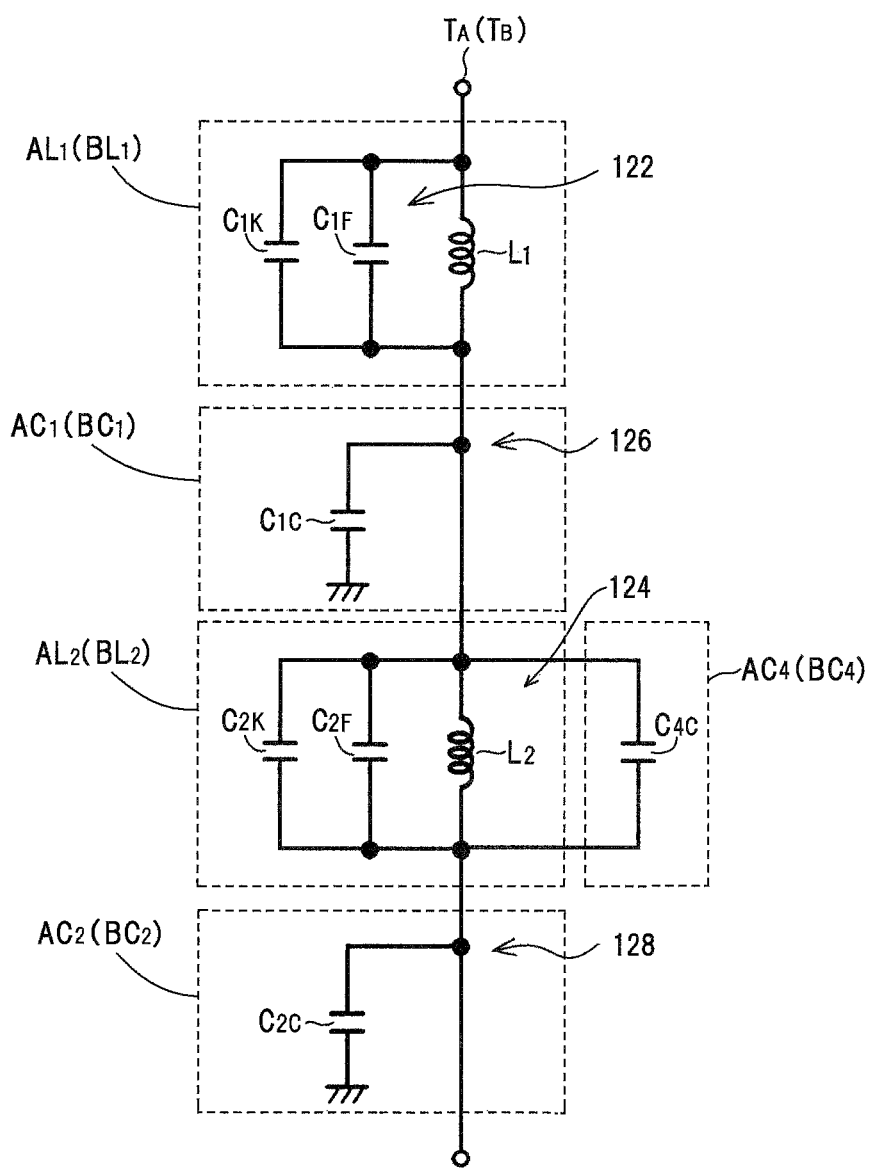
FIG. 15 is a circuit diagram illustrating an equivalent circuit of a filter in the filter unit of FIG. 14.

FIG. 14 illustrates a physical structure within a filter unit 54(IN) in a third exemplary embodiment. FIG. 15 illustrates an equivalent circuit of a filter 102A(102B) mounted in the filter unit 54(IN).

In the present exemplary embodiment, a fourth condenser $AC_4(BC_4)$ electrically connected in parallel with the toroidal coil $AL_2(BL_2)$ is disposed in the casing 104. The fourth condenser $AC_4(BC_4)$ is a commercially available two-terminal type condenser and may be disposed laterally adjacent to the second condenser $AC_2(BC_2)$ below the toroidal coil $AL_2(BL_2)$, as illustrated in FIG. 14. One terminal of the condenser $AC_4(BC_4)$ is connected to the upper terminal of the toroidal coil $AL_2(BL_2)$ via a connection conductor 150A(150B), and the other terminal is connected to the lower terminal of the toroidal coil $AL_2(BL_2)$ via the connection conductor 152A(152B).

In the present exemplary embodiment, as illustrated in FIG. 15, a second parallel resonance circuit 124 having a second parallel resonance frequency $f_{PL}$ coinciding with or near to the basic frequency of the second high frequency wave LF is formed by the inductor $L_2$, the inter-coil line capacity $C_{2K}$ and the ground stray capacity $C_{2F}$ of the toroidal coil $AL_2(BL_2)$, and the fourth condenser $AC_4(BC_4)$, i.e. a fourth capacitor $C_{4C}$. Here, the second parallel resonance frequency $f_{PL}$ is represented by the following Equation (6).

$$f_{PL} = 1/2\pi \sqrt{L_2(C_{2K}+C_{2F}+C_{4C})} \qquad (6)$$

When the fourth condenser $AC_4(BC_4)$ is added to the second parallel resonance circuit 124 as described above, a combined capacitance $(C_{2K}+C_{2F}+C_{4C})$ increases so that the second parallel resonance frequency $f_{PL}$ may be set to as low a frequency region as possible. Accordingly, when the basic frequency of the second high frequency wave LF has a considerably low value (e.g., 400 kHz), the second parallel resonance frequency $f_{PL}$ may be made to coincide with or to be near to the basic frequency 400 of the basic frequency (400 kHz) of the second high frequency wave LF by properly selecting the capacitance of the fourth condenser $AC_4(BC_4)$ without specially changing the physical layout or electric characteristics of the toroidal coil $AL_2(BL_2)$ (even without increasing the values of $L_2$, $C_{2F}$).

The first serial resonance circuit 126 in the present exemplary embodiment is formed by the inductor $L_1$ of the air core coil $AL_1(BL_1)$, the first condenser $AC_1(BL_1)$, i.e. the first capacitor $C_{1C}$, the inductor $L_2$, the inter-coil line capacity $C_{2K}$ and the ground stray capacity $C_{2F}$ of the toroidal coil $AL_2(BL_2)$, the fourth condenser $AC_4(BC_4)$, i.e. the fourth capacitor $C_{4C}$, and the second condenser $AC_2$ ($BL_2$), i.e. the second capacitor $C_{2C}$. As in the first exemplary embodiment described above, when the capacitance of the first condenser $AC_1(BL_1)$ is properly selected, the first serial resonance frequency $f_{SH}$ in the serial resonance circuit 126 may be set to be properly in the middle of the second parallel resonance frequency $f_{PL}$ and the first parallel resonance frequency $f_{PH}$.

The first parallel resonance circuit 122 in the present exemplary embodiment is formed by the inductor $L_1$, the inter-coil line capacity $C_{1K}$ and ground stray capacity $C_{1F}$ of the air core coil $AL_1(BL_1)$ as in the first exemplary embodiment. In addition, the second serial resonance circuit 128 is formed by the inductor $L_2$ of the toroidal coil $AL_2(BL_2)$ and the second condenser $AC_2(BC_2)$, i.e. the second capacitor $C_{2C}$ as in the first exemplary embodiment.

Meanwhile, although the filter unit 54(IN) of FIG. 14 is a two frequency-type filter unit, the present exemplary embodiment may also be applied to a three frequency-type filter unit. 54(IN). That is, in the filter unit 54(IN) of FIG. 11, for example, the fourth condenser $AC_4(BC_4)$ electrically connected in parallel to the lower toroidal coil $AL_2(BL_2)$ may be provided within the casing 104. In addition, as needed, a fifth condenser (not illustrated) electrically connected in parallel with the toroidal coil $AL_3(BL_3)$ may be provided in the casing 104.

Other Exemplary Embodiment or Modified Example

In the air core coil $AL_1(BL_1)$, the ratio H/D of the coil diameter (outer diameter) D in relation to the coil length H may be set to be 1 or more. In general, as the air core coil $AL_1(BL_1)$ is formed thin and long, H/D becomes large. To the contrary, as the air core coil $AL_1(BL_1)$ is formed thick and short, H/D becomes small.

The toroidal coils $AL_2(BL_2)$, $AL_3(BL_3)$ in the exemplary embodiments described above are formed by winding coil conductors on single toroidal cores 112, 140 in which a plurality of single toroidal cores TC are stacked one on another. One toroidal coil or one set of toroidal coils may be also formed by connecting a plurality of toroidal coils of this type in series without holding a condenser therebetween.

Figure 16:
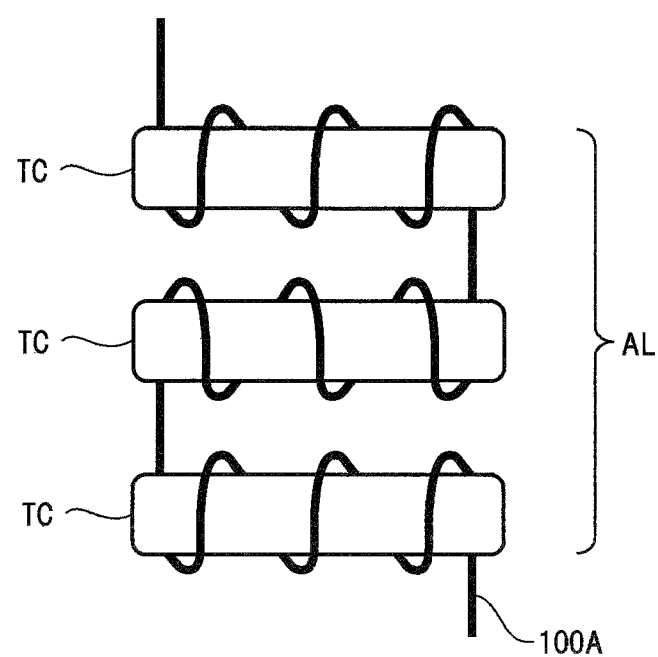
FIG. 16 is a view illustrating a modified example of the toroidal core.

In addition, as illustrated in FIG. 16, a composite toroidal coil AL may be used in which the composite toroidal coil AL is formed by connecting a plurality of single toroidal coils TR (three in the illustrated example), each of which is formed by winding a coil around a single toroidal core TC, in series to each other. Meanwhile, FIG. 16 illustrates the toroidal coil AL on the first power feeding line 100A only and omits the toroidal coil BL on the second power feeding line 100B.

In the exemplary embodiments described above, the condensers $AC_1(BC_1)$, $AC_2(BC_2)$, $AC_3(BC_3)$, $AC_4(BC_4)$ included in the filter 102A(102B) are accommodated in the casing 104. However, some or all of the condensers may be disposed outside the casing 104. In addition, a ground potential member other than the casing 104 may be used for the condensers.

The present invention is never limited to a filter for a power feeding line such as, for example, a heater power feeding line, and may be applied to any filter or filter unit provided on a pair of lines or a single line that electrically connects a predetermined electric member within the chamber with an external circuit of a power system or a signal system provided outside the chamber.

In addition, the present invention may also be applied to other apparatus for plasma processing such as, for example, plasma CVD, plasma oxidation, plasma nitriding, or sputtering, without being limited to a plasma etching apparatus. In addition, the processing target substrate in the present disclosure is not limited a semiconductor wafer but may be, for example, a flat panel display, an organic EL, various substrates for a solar cell, a photo mask, a CD substrate, or a printed board.

DESCRIPTIONS OF SYMBOLS

10: chamber
12: susceptor (lower electrode)
24: exhaust apparatus
28: high frequency power supply (for plasma generation)
30, 136: high frequency power supply (for ion drawing-in)
32, 132: matching unit
40: heating element
40(IN): inner heating line
40(OUT): outer heating line
54(N), 54(OUT): filter unit
58(N), 58(OUT): heater power supply
100(A): first power feeding line
100(B): second power feeding line
102(A): first filter
102(B): second filter
104: casing
$AL_1$, $BL_1$: air core coil
$AL_2$, $BL_2$: (lower) toroidal coil
$AL_3$, $BL_3$: upper toroidal coil
$AC_1$, $BC_1$: first condenser
$AC_2$, $BC_2$: second condense
$AC_3$, $BC_3$: third condenser
$AC_4$, $BC_4$: fourth condenser
112, 140: toroidal core.

What is claimed is:

1. A plasma processing apparatus comprising:
a processing container in which a plasma processing is performed on a substrate disposed on a susceptor provided with a predetermined electric member;
an external circuit provided outside the processing container and electrically connected to the predetermined electric member within the processing container via a line; and
a filter provided on the line and configured to block a first noise of a first high frequency wave applied from a first high frequency power supply and a second noise of a second high frequency wave applied from a second high frequency power supply, the first high frequency wave having a first high frequency and the second high frequency wave having a second high frequency lower than the first high frequency, and the first noise and the second noise being directed to the external circuit via the line,
wherein the filter comprises:
a conductive casing;
an air core coil provided at an uppermost portion in the conductive casing;
a toroidal coil connected in series with the air core coil in the conductive casing;
a first condenser electrically connected between a connection point between the air core coil and the toroidal coil and the conductive casing; and
a second condenser connected between a terminal of the toroidal coil at a side of the external circuit and the conductive casing,
wherein, in an equivalent of the filter, a first inter-coil line capacity generated around the air core coil and a first stray capacity generated between the air core coil and the conductive casing are connected in parallel to a first inductor serving as a net inductive element of the air core coil, and a second inter-coil line capacity generated around the toroidal coil and a second stray capacity generated between the toroidal coil and the conductive casing are connected in parallel to a second inductor serving as a net inductive element of the toroidal coil,
a first parallel resonance circuit having a first parallel resonance frequency coinciding with or near to the first high frequency is formed by the first inductor, the first inter-coil line capacity, and the first stray capacity, and
a second parallel resonance circuit having a second parallel resonance frequency coinciding with or near to the second high frequency is formed by the second inductor, the second inter-coil line capacity, and the second stray capacity.

2. A plasma processing apparatus comprising:
a processing container in which a plasma processing is performed on a substrate;
a first electrode configured to hold the substrate and wherein the first electrode includes a heater that heats the substrate;
a second electrode which faces the first electrode;
a first high frequency power supply electrically connected to the first electrode and configured to apply a first high frequency wave having a first high frequency to the first electrode;
a second high frequency power supply electrically connected to the first electrode and configured to apply a second high frequency wave to the first electrode, wherein the second high frequency wave has a second high frequency which is lower than the first high frequency;
a heater power supply electrically connected to the heater through a power feeding line and configured to supply power to the heater through the power feeding line; and
a filter provided on the power feeding line and configured to block a first noise from the first high frequency wave and a second noise from the second high frequency wave entering the power feeding line of the heater power supply,
wherein the filter comprises:
a conductive casing;
an air core coil provided at an uppermost portion in the conductive casing;
a toroidal coil connected in series with the air core coil in the conductive casing;
a first condenser electrically connected between a connection point between the air core coil and the toroidal coil and the conductive casing; and
a second condenser connected between a terminal of the toroidal coil at a side of the heater power supply and the conductive casing,
wherein, in an equivalent of the filter, a first inter-coil line capacity generated around the air core coil and a first stray capacity generated between the air core coil and the conductive casing are connected in parallel to a first inductor serving as a net inductive element of the air core coil, and a second inter-coil line capacity generated around the toroidal coil and a second stray capacity generated between the toroidal coil and the conductive casing are connected in parallel to a second inductor serving as a net inductive element of the toroidal coil,
a first parallel resonance circuit having a first parallel resonance frequency coinciding with or near to the first high frequency is formed by the first inductor, the first inter-coil line capacity, and the first stray capacity, and
a second parallel resonance circuit having a second parallel resonance frequency coinciding with or near to the second high frequency is formed by the second inductor, the second inter-coil line capacity, and the second stray capacity.

3. The plasma processing apparatus of claim 2, wherein the power feeding line includes a first power feeding line and a second power feeding line which are connected to both ends of the heater, respectively,
the air core coil includes a first air core coil constituting a portion of the first power feeding line, and a second air core coil constituting a portion of the second power feeding line,
wherein the first air core coil and the second air core coil are spirally wound in substantially equal winding lengths while being overlapped from each other and progressing in a vertical direction within the conductive casing,
the toroidal coil includes a first toroidal coil constituting a portion of the first power feeding line, and a second toroidal coil constituting a portion of the second power feeding line, and
the first toroidal coil and the second toroidal coil are wound in substantially equal winding lengths around a common toroidal core so that directions of magnetic fluxes are aligned within the common toroidal core.

4. The plasma processing apparatus of claim 2, wherein the first high frequency wave mainly contributes to plasma generation of a processing gas within the processing container, and the second high frequency wave mainly contributes to ion drawing-in from the plasma to the substrate mounted on the first electrode.

5. The plasma processing apparatus of claim 1, wherein a first serial resonance circuit having a first serial resonance frequency in the middle of the second high frequency and the first high frequency is formed by the first inductor, the first condenser, the second inductor, the second inter-coil line capacity, the second stray capacity, and the second condenser, and a second serial resonance circuit having a second serial resonance frequency lower than the second high frequency is formed by the second inductor and the second condenser.

6. The plasma processing apparatus of claim 1, wherein the air core coil is configured such that a self-resonance frequency thereof coincides with or is near to the first high frequency.

7. The plasma processing apparatus of claim 6, wherein the number of turns of the air core coil is adjusted such that the self-resonance frequency thereof coincides with or is near to the first high frequency.

8. The plasma processing apparatus of claim 1, wherein the toroidal coil is configured such that a self-resonance frequency thereof coincides with or is near to the second high frequency.

9. The plasma processing apparatus of claim 1, wherein the number of turns of the toroidal coil is adjusted such that a self-resonance frequency thereof coincides with or is near to the second high frequency.

10. The plasma processing apparatus of claim 8, wherein a thickness of a toroidal core provided within the toroidal coil is adjusted such that the self-resonance frequency thereof coincides with or is near to the second high frequency.

11. The plasma processing apparatus of claim 1, wherein the conductive casing is grounded.

12. The plasma processing apparatus of claim 1, wherein the conductive casing has a cylindrical side wall, and the air core coil and a toroidal core provided within the toroidal coil are coaxially disposed.

13. The plasma processing apparatus of claim 1, wherein the air core coil functions as a concentration constant element for the first and second high frequencies.

14. The plasma processing apparatus of claim 1, wherein when a winding diameter D and a winding height H are formed by the air core coil, H/D is 1 or less.

15. The plasma processing apparatus of claim 1, wherein when a toroidal core provided within the toroidal coil has an inner radius a, an outer radius b, and a thickness t, t≥2(b−a).

16. The plasma processing apparatus of claim 1, wherein a toroidal core provided within the toroidal coil is formed by stacking a plurality of single toroidal cores each having a predetermined inner radius, outer radius, and thickness.

17. In a plasma processing apparatus in which a predetermined electric member within a processing container where a plasma processing is performed is electrically connected to an external circuit disposed outside the processing container via a line, a filter unit which is provided on the line and configured to block noises of a plurality of high frequency waves having different frequencies and entering the line to be directed to the external circuit, the plurality of high frequency waves being applied from a plurality of high frequency power supplies, respectively, wherein the plurality of high frequency waves includes at least a first high frequency wave having a first high frequency and a second high frequency wave having a second high frequency, the filter unit comprising:

a conductive casing;

an air core coil provided at an uppermost portion in the conductive casing;

a toroidal coil connected in series with the air core coil in the conductive casing;

a first condenser electrically connected between a connection point between the air core coil and the toroidal coil and the conductive casing; and a second condenser connected between a terminal of the toroidal coil at a side of the external circuit and the casing, wherein, in an equivalent of the filter, a first inter-coil line capacity generated around the air core coil and a first stray capacity generated between the air core coil and the conductive casing are connected in parallel to a first inductor serving as a net inductive element of the air core coil, and a second inter-coil line capacity generated around the toroidal coil and a second stray capacity generated between the toroidal coil and the conductive casing are connected in parallel to a second inductor serving as a net inductive element of the toroidal coil, a first parallel resonance circuit having a first parallel resonance frequency coinciding with or near to the first high frequency is formed by the first inductor, the first inter-coil line capacity, and the first stray capacity, and a second parallel resonance circuit having a second parallel resonance frequency coinciding with or near to the second high frequency is formed by the second inductor, the second inter-coil line capacity, and the second stray capacity.

18. In a plasma processing apparatus in which a heating element provided in a first electrode within a processing container where a plasma processing is performed is electrically connected to a heater power supply disposed outside the processing container via a power feeding line, a filter unit which is provided on the power feeding line and configured to block noises of a plurality of high frequency waves having different frequencies and entering the power feeding line to be directed to the heater power supply, the plurality of high frequency waves being applied from a plurality of high frequency power supplies, respectively, wherein the plurality of high frequency waves includes at least a first high frequency wave having a first high frequency and a second high frequency wave having a second high frequency, the filter unit comprising:

a conductive casing;

an air core coil provided at an uppermost portion in the conductive casing;

a toroidal coil connected in series with the air core coil in the conductive casing;

a first condenser electrically connected between a connection point between the air core coil and the toroidal coil and the conductive casing, and the conductive casing; and a second condenser connected between a terminal of the toroidal coil at a side of the heater power supply and the casing, wherein, in an equivalent of the filter, a first inter-coil line capacity generated around the air core coil and a first stray capacity generated between the air core coil and the conductive casing are connected in parallel to a first inductor serving as a net inductive element of the air core coil, and a second inter-coil line capacity generated around the toroidal coil and a second stray capacity generated between the toroidal coil and the conductive casing are connected in parallel to a second inductor serving as a net inductive element of the toroidal coil, a first parallel resonance circuit having a first parallel resonance frequency coinciding with or near to the first high frequency is formed by the first inductor, the first inter-coil line capacity, and the first stray capacity, and a second parallel resonance circuit having a second parallel resonance frequency coinciding with or near to the second high frequency is formed by the second inductor, the second inter-coil line capacity, and the second stray capacity.

* * * * *